(12) United States Patent
Hirano et al.

(10) Patent No.: US 11,217,445 B2
(45) Date of Patent: Jan. 4, 2022

(54) SUPPORTING SUBSTRATE, SUPPORTING SUBSTRATE-ATTACHED LAMINATE AND METHOD FOR MANUFACTURING A PACKAGE SUBSTRATE FOR MOUNTING A SEMICONDUCTOR DEVICE

(71) Applicant: MITSUBISHI GAS CHEMICAL COMPANY, INC., Tokyo (JP)

(72) Inventors: Syunsuke Hirano, Yamagata (JP);
Yoshihiro Kato, Yamagata (JP);
Takaaki Ogashiwa, Yamagata (JP);
Kazuaki Kawashita, Yamagata (JP);
Youichi Nakajima, Yamagata (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 16/323,172

(22) PCT Filed: Aug. 4, 2017

(86) PCT No.: PCT/JP2017/028432
§ 371 (c)(1),
(2) Date: Feb. 4, 2019

(87) PCT Pub. No.: WO2018/026004
PCT Pub. Date: Feb. 8, 2018

(65) Prior Publication Data
US 2019/0181000 A1 Jun. 13, 2019

(30) Foreign Application Priority Data

Aug. 5, 2016 (JP) .............................. JP2016-154890
Apr. 25, 2017 (JP) .............................. JP2017-086338

(51) Int. Cl.
*H01L 21/02* (2006.01)
*H01L 23/12* (2006.01)
(Continued)

(52) U.S. Cl.
CPC ........ *H01L 21/022* (2013.01); *H01L 21/4857* (2013.01); *H01L 23/12* (2013.01);
(Continued)

(58) Field of Classification Search
None
See application file for complete search history.

(56) References Cited

U.S. PATENT DOCUMENTS

2005/0064183 A1* 3/2005 Lunsford .................. B32B 5/16
428/354
2007/0289128 A1 12/2007 Takano et al.
(Continued)

FOREIGN PATENT DOCUMENTS

JP 2001-57472 2/2001
JP 2005-101137 4/2005
(Continued)

OTHER PUBLICATIONS

Official Communication issued in International Application No. PCT/JP2017/028432, dated Oct. 17, 2017 and English language translation thereof.

*Primary Examiner* — Khaja Ahmad
(74) *Attorney, Agent, or Firm* — Greenblum & Bernstein, P.L.C.

(57) ABSTRACT

A method for manufacturing a package substrate for mounting a semiconductor device including: a first laminate preparing step of preparing a first laminate including a resin layer, a bonding layer that is provided on at least one surface
(Continued)

side of the resin layer and includes peeling means, and a first metal layer provided on the bonding layer; a first wiring forming step of forming a first wiring conductor in the first laminate by etching the first metal layer; a second laminate forming step of forming a second laminate by laminating an insulating resin layer and a second metal layer in this order on a surface of the first laminate, the surface being provided with the first wiring conductor; a second wiring forming step of forming a second wiring conductor on the insulating resin layer by forming a non-through hole in the insulating resin layer.

9 Claims, 6 Drawing Sheets

(51) Int. Cl.
    *H01L 21/48*     (2006.01)
    *H01L 23/538*     (2006.01)
    *H05K 3/00*     (2006.01)
    *H01L 23/498*     (2006.01)
    *H01L 23/522*     (2006.01)
    *H01L 23/528*     (2006.01)
    *H05K 3/46*     (2006.01)

(52) U.S. Cl.
    CPC ...... *H01L 23/49822* (2013.01); *H01L 23/528* (2013.01); *H01L 23/5226* (2013.01); *H01L 23/5383* (2013.01); *H05K 3/007* (2013.01); *H05K 3/0067* (2013.01); *H05K 3/0097* (2013.01); *H05K 3/4623* (2013.01); *H05K 3/4629* (2013.01); *H05K 3/4682* (2013.01); *H05K 2203/1536* (2013.01)

(56) References Cited

U.S. PATENT DOCUMENTS

| | | | | |
|---|---|---|---|---|
| 2008/0202661 | A1* | 8/2008 | Kobayashi | H05K 3/0097 156/50 |
| 2009/0291319 | A1* | 11/2009 | Nagatani | C25D 5/34 428/607 |
| 2010/0096078 | A1* | 4/2010 | Nakamura | H05K 3/4652 156/247 |
| 2010/0314037 | A1 | 12/2010 | Liu | |
| 2011/0000706 | A1* | 1/2011 | Shomura | H05K 3/4602 174/262 |
| 2011/0079349 | A1* | 4/2011 | Cho | H05K 3/4682 156/247 |
| 2011/0159282 | A1* | 6/2011 | Kim | H05K 3/4682 428/344 |
| 2014/0020931 | A1 | 1/2014 | Kobayashi | |
| 2015/0208518 | A1* | 7/2015 | Fujino | H05K 3/025 216/13 |
| 2016/0066433 | A1* | 3/2016 | Kobayashi | H01L 23/49822 174/255 |

FOREIGN PATENT DOCUMENTS

| | | |
|---|---|---|
| JP | 2007-335698 | 12/2007 |
| JP | 2009-32918 | 2/2009 |
| JP | 2012-94840 | 5/2012 |
| JP | 2014-179429 | 9/2014 |
| KR | 10-2007-0120013 | 12/2007 |
| TW | 200803681 A | 1/2008 |
| TW | 201218323 A | 5/2012 |
| TW | 201433221 A | 8/2014 |
| WO | 2015/076373 A | 5/2015 |

\* cited by examiner

SUPPORTING SUBSTRATE, SUPPORTING SUBSTRATE-ATTACHED LAMINATE AND METHOD FOR MANUFACTURING A PACKAGE SUBSTRATE FOR MOUNTING A SEMICONDUCTOR DEVICE

TECHNICAL FIELD

The present invention relates to a supporting substrate, a supporting substrate-attached laminate and a method for manufacturing a package substrate for mounting a semiconductor device.

BACKGROUND ART

In recent years, semiconductor packages widely used in electronic devices, communication devices, personal computers, etc., have been increasingly enhanced in functionality and downsized. Accordingly, there is a demand for reduction in thickness of printed wiring boards and package substrate for mounting semiconductor devices in semiconductor packages. Normally, a printed wiring board and a package substrate for mounting a semiconductor device are fabricated by laminating a layer that serves as a circuit pattern (hereinafter also simply referred to as a "wiring conductor") and an insulating material on a supporting substrate.

As a method for manufacturing such a package substrate for mounting a semiconductor device, for example, a method in which a circuit formation supporting substrate formed by provision of a first insulating resin on a carrier foil surface of a carrier foil-included ultrathin copper foil is used, a first wiring conductor is formed by means of pattern electrolytic copper plating, a second insulating resin is further laminated and then a second wiring conductor is formed is disclosed (see, for example, Patent Literature 1 indicated below).

CITATION LIST

Patent Literature

Patent Literature 1: Japanese Patent Laid-Open No. 2005-101137

SUMMARY OF INVENTION

Technical Problem

In the aforementioned method for manufacturing a package substrate for mounting a semiconductor device according to Patent Literature 1, the first wiring conductor is manufactured using the "pattern plating process" having many steps, such as chemical polishing, resist attachment, exposure, development, drying, water washing, acid washing, electroplating, drying, resist peeling and drying. Examples of such method include a method using the "M-SAP" in which a laminate plate including a thin copper foil attached to a surface of an insulating layer is subjected to pattern plating such as described above, and a method using the "SAP" in which a surface of an insulating layer is directly subjected to pattern plating without using a copper foil. However, such pattern plating process is likely to cause detachment of a closely-attached resist due to, e.g., a physical impact and foreign substance contamination during the process because of having many steps, and thus is a process that is likely to cause a defect in circuit formation in a semiconductor mounting package substrate. Therefore, there is a demand for a high yield method that enables efficient formation of a circuit through fewer steps and is less likely to cause a defect in circuit formation.

In order to solve the above problem, an object of the present invention is to provide a method for manufacturing a package substrate for mounting a semiconductor device that has high-production efficiency and high-yield, and a supporting substrate and a supporting substrate-attached laminate for use in the method.

Solution to Problem

<1> A method for manufacturing a package substrate for mounting a semiconductor device including:

a first laminate preparing step of preparing a first laminate including a resin layer, a bonding layer that is provided on at least one surface side of the resin layer and includes peeling means, and a first metal layer provided on the bonding layer;

a first wiring forming step of forming a first wiring conductor in the first laminate by etching the first metal layer;

a second laminate forming step of forming a second laminate by laminating an insulating resin layer and a second metal layer in this order on a surface of the first laminate, the surface being provided with the first wiring conductor;

a second wiring forming step of forming a second wiring conductor on the insulating resin layer by forming a non-through hole in the insulating resin layer, the non-through hole extending to the first wiring conductor, and subjecting the insulating resin layer with the non-through hole formed therein to electrolytic plating and/or electroless plating; and a peeling step of peeling at least the resin layer off from the second laminate with the second wiring conductor formed therein.

<2> The method for manufacturing a package substrate for mounting a semiconductor device according to <1> above, wherein the first wiring forming step includes:

a step of laminating a resist on the first metal layer of the first laminate;

a step of forming a wiring circuit pattern on the first metal layer by developing the resist via photolithography; and a step of forming a first wiring conductor on the bonding layer by patterning the first metal layer using an etching liquid and removing the wiring circuit pattern on the patterned first metal layer.

<3> The method for manufacturing a package substrate for mounting a semiconductor device according to <1> or <2> above, wherein in the second laminate forming step, the first wiring conductor is subjected to roughening and the insulating resin layer and the second metal layer are laminated in this order on the surface provided with the first wiring conductor subjected to the roughening, via heating and pressure application.

<4> The method for manufacturing a package substrate for mounting a semiconductor device according to any one of <1> to <3> above, wherein in the second wiring forming step, an inner wall of the non-through hole is connected via the electrolytic plating and/or electroless plating and the second wiring conductor is formed via a subtractive process or a semi-additive process.

<5> The method for manufacturing a package substrate for mounting a semiconductor device according to any one of <1> to <4> above, wherein:

steps that are same as the second laminate forming step and the second wiring forming step are further repeated n times for the second laminate including the second wiring conductor formed on the insulating resin layer by the second wiring forming step to form a n-th laminate having a built-up structure including (n+2)-layer wiring conductors; and in the peeling step, at least the resin layer is peeled from the n-th laminate.

<6> The method for manufacturing a package substrate for mounting a semiconductor device according to any one of <1> to <5> above, wherein in the second wiring forming step, the non-through hole is formed by a laser.

<7> The method for manufacturing a package substrate for mounting a semiconductor device according to any one of <1> to <6> above, wherein in the peeling step, at least the resin layer is peeled via physical means.

<8> The method for manufacturing a package substrate for mounting a semiconductor device according to any one of <1> to <7> above, wherein a thickness of the resin layer is no less than 1 μm.

<9> The method for manufacturing a package substrate for mounting a semiconductor device according to any one of <1> to <8> above, wherein a thickness of the first metal layer is no more than 100 μm.

<10> The method for manufacturing a package substrate for mounting a semiconductor device according to any one of <1> to <9> above, wherein a thickness of the bonding layer is no more than 100 μm.

<11> The method for manufacturing a package substrate for mounting a semiconductor device according to any one of <1> to <10> above, wherein a thickness of the first laminate is 30 to 300 μm.

<12> The method for manufacturing a package substrate for mounting a semiconductor device according to any one of <1> to <11> above, wherein a thickness of the insulating resin layer is 5 to 100 μm.

<13> The method for manufacturing a package substrate for mounting a semiconductor device according to any one of <1> to <12> above, wherein the peeling step includes a step of removing at least the bonding layer from the second laminate with at least the resin layer peeled therefrom.

<14> The method for manufacturing a package substrate for mounting a semiconductor device according to <13> above, wherein the peeling step, the removal is performed using an etching liquid or a desmear liquid.

<15> The method for manufacturing a package substrate for mounting a semiconductor device according to <13> above, wherein in the peeling step, the removal is performed via plasma treatment.

<16> The method for manufacturing a package substrate for mounting a semiconductor device according to any one of <1> to <15> above, wherein the peeling means is an intermediate layer that includes a carrier layer and a metal film having a thickness of no more than 5 μm and is disposed between the bonding layer and the resin layer, and the carrier layer is disposed on the resin layer side.

<17> The method for manufacturing a package substrate for mounting a semiconductor device according to <16> above, wherein in the peeling step, the resin layer and the carrier layer are peeled from the second laminate.

<18> The method for manufacturing a package substrate for mounting a semiconductor device according to any one of <1> to <15> above, wherein the peeling means is an intermediate layer that includes a fluorine-based resin and is disposed between the bonding layer and the resin layer.

<19> The method for manufacturing a package substrate for mounting a semiconductor device according to <18> above, wherein in the peeling step, the resin layer and the intermediate layer are peeled from the second laminate.

<20> The method for manufacturing a package substrate for mounting a semiconductor device according to any one of <1> to <15> above, wherein the peeling means is a thermally expandable particle, and the bonding layer includes the thermally expandable particle on a side that is an interface with the first metal layer.

<21> The method for manufacturing a package substrate for mounting a semiconductor device according to <20> above, wherein in the peeling step, at least the resin layer and the bonding layer are peeled from the second laminate.

<22> The method for manufacturing a package substrate for mounting a semiconductor device according to any one of <1> to <15> above, wherein the peeling means is an intermediate layer that includes a release layer and a metal film having a thickness of no less than 1 μm and is provided between the bonding layer and the resin layer.

<23> The method for manufacturing a package substrate for mounting a semiconductor device according to <22> above, wherein in the peeling step, the resin layer and the intermediate layer are peeled from the second laminate.

<24> The method for manufacturing a package substrate for mounting a semiconductor device according to any one of <16> to <18> above, wherein the peeling step further includes a step' of removing the intermediate layer.

<25> The method for manufacturing a package substrate for mounting a semiconductor device according to any one of <16> to <19> above, wherein a thickness of the intermediate layer is no less than 1 μm.

<26> A supporting substrate comprising:

a resin layer;

a bonding layer that is provided on at least one surface side of the resin layer and includes peeling means; and a metal layer provided on the bonding layer.

<27> The supporting substrate according to <26> above, wherein the peeling means is an intermediate layer that includes a carrier layer and a metal film having a thickness of no more than 5 μm and is disposed between the bonding layer and the resin layer, and the carrier layer is disposed on the resin layer side.

<28> The supporting substrate according to <26> above, wherein the peeling means is an intermediate layer that includes a fluorine-based resin and is disposed between the bonding layer and the resin layer.

<29> The supporting substrate according to <26> above, wherein the peeling means is a thermally expandable particle, and the bonding layer includes the thermally expandable particle on a side that is an interface with the metal layer.

<30> The supporting substrate according to <26> above, wherein the peeling means is an intermediate layer that includes a release layer and a metal film having a thickness of no less than 1 μm and is provided between the bonding layer and the resin layer.

<31> The supporting substrate according to any one of <26> to <30> above, wherein the bonding layer and the metal layer are disposed on each of opposite surfaces of the resin layer.

<32> A supporting substrate-attached laminate including:
a resin layer;
a bonding layer that is provided on at least one surface side of the resin layer and includes peeling means;
an insulating resin layer provided on the bonding layer;
a first wiring conductor embedded in the insulating resin layer; and
a second metal layer provided on the insulating resin layer.

Advantageous Effects of Invention

According to a method for manufacturing a package substrate for mounting a semiconductor device according to the present invention, it is possible to provide a method for manufacturing a package substrate for mounting a semiconductor device that has high-production efficiency and high-yield and a supporting substrate and a supporting substrate-attached laminate for use in the method.

DESCRIPTION OF EMBODIMENT

Figure 1:
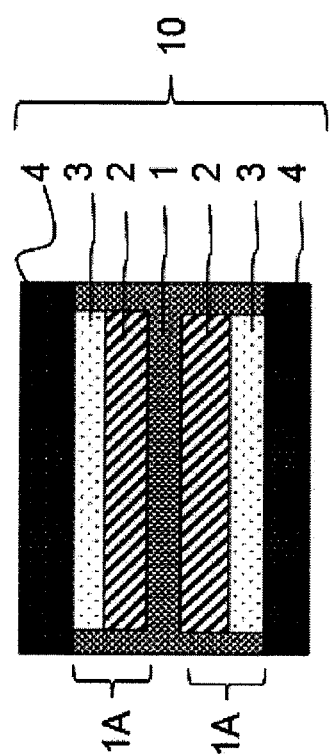
FIG. 1 is a schematic diagram illustrating one embodiment of a configuration of a first laminate (supporting substrate).

An embodiment of the present invention will be described below. However, an aspect of the present invention is not limited to the embodiment described below.

A method for manufacturing a package substrate for mounting a semiconductor device according to the present embodiment (hereinafter may be simply referred to as the "manufacturing method according to the present embodiment") includes:
a first laminate preparing step of preparing a first laminate including a resin layer, a bonding layer that is provided on at least one surface side of the resin layer and includes peeling means, and a first metal layer provided on the bonding layer;
a first wiring forming step of forming a first wiring conductor in the first laminate by etching the first metal layer;
a second laminate forming step of forming a second laminate by laminating an insulating resin layer and a second metal layer in this order on a surface of the first laminate, the surface being provided with the first wiring conductor;
a second wiring forming step of forming a second wiring conductor on the insulating resin layer by forming a non-through hole in the insulating resin layer, the non-through hole extending to the first wiring conductor, and subjecting the insulating resin layer with the non-through hole formed therein to electrolytic plating and/or electroless plating; and
a peeling step of peeling at least the resin layer off from the second laminate with the second wiring conductor formed therein.

In the method for manufacturing a package substrate for mounting a semiconductor device according to the present embodiment, in the first laminate preparing step, a laminate (supporting substrate) including a bonding layer including peeling means, and a (first) metal layer in this order on a resin layer is used as a first laminate. Since the metal layer is formed on the bonding layer in the supporting substrate, when a first wiring conductor is formed, the first metal layer can be subjected to etching. Therefore, there is no need to use a pattern plating process in forming a first wiring conductor, but a package substrate for mounting a semiconductor device can be fabricated using a subtractive process alone.

Here, the "subtractive process" is a method in which a circuit is formed by means of etching, and for example, enables a circuit to be formed by attachment of a resist film and etching. Also, the subtractive process can have steps such as, for example, chemical polishing, resist attachment, exposure, development, water washing, etching, water washing, resist peeling, water washing, drying and inner layer roughening.

A supporting substrate according to the present embodiment that can be used in the manufacturing method according to the present embodiment includes: a resin layer, a bonding layer that is provided on at least one surface side of the resin layer and includes peeling means; and a metal layer provided on the bonding layer. The metal layer corresponds to the "first metal layer" in the manufacturing method according to the present embodiment, and the supporting substrate can be used as the "first laminate" in the manufacturing method according to the present embodiment. Although the peeling means will be described later, for example, an intermediate layer provided between the bonding layer and the resin layer can be used as peeling means or peeling means such as thermally expandable particles can be contained in the bonding layer.

In the method for manufacturing a package substrate for mounting a semiconductor device according to the present embodiment, a supporting substrate-attached laminate including: a resin layer, a bonding layer that is provided on at least one surface side of the resin layer and includes peeling means; an insulating resin layer provided on the bonding layer; a first wiring conductor embedded in the insulating resin layer; and a second metal layer provided on the insulating resin layer is fabricated as an intermediate product. The supporting substrate-attached laminate according to the present embodiment corresponds to, for example, the "second laminate" formed by the second laminate forming step in the manufacturing method according to the present embodiment. A package substrate for mounting a semiconductor device can be obtained by peeling at least the resin layer off from the supporting substrate-attached laminate.

The present embodiment will be described in detail below, as necessary, with reference to the drawings; however, the present invention is not limited to the present embodiment described below. Various alterations of the present invention are possible without departing from the spirit of the invention. In the drawings, components that are identical to each other are provided with a same reference numeral and overlapping description thereof will be omitted. Also, positional relationships such as top, bottom, right and left are based on the positional relationships indicated in the drawings unless otherwise stated. Furthermore, the dimensional ratios in the drawings are not limited to the ratios illustrated in the drawings. In the present description, each laminate is formed of respective layers adhering to one another; however, the respective layers may be those that can be peeled from one another as necessary.

<<Method for Manufacturing Package Substrate for Mounting a Semiconductor Device>>

As described above, the manufacturing method according to the present embodiment at least includes the first laminate preparing step, the first wiring forming step, the second laminate forming step, the second wiring forming step and the peeling step. The manufacturing method according to the present embodiment may arbitrarily include other steps and the like as necessary.

[First Laminate Preparing Step]

The first laminate preparing step is a step of preparing a first laminate including a resin layer, a bonding layer that is provided on at least one surface side of the resin layer and includes peeling means, and a first metal layer provided on the bonding layer. As described later, an intermediate layer can be provided between the resin layer and the bonding layer, as, e.g., peeling means.

(First Laminate (Supporting Substrate))

First, the first laminate prepared in the present step will be described. FIG. 1 is s schematic diagram illustrating one embodiment of a configuration of a first laminate (supporting substrate). As illustrated in FIG. 1, a first laminate 10 in the present embodiment includes an intermediate layer 2, a bonding layer 3 and a first metal layer 4 provided in this order on each of opposite surfaces of a resin layer 1. In the first laminate (supporting substrate) in the present embodiment, as peeling means for the bonding layers 3, the intermediate layers 2 are provided between the resin layer 1 and the respective bonding layers 3.

For example, if each of layers immediately underlying the respective first metal layers 4 is a metal layer of, e.g., a carrier copper foil-included ultrathin copper foil, both the first metal layer 4 and the immediately underlying layer are removed at the time of etching. In this case, when an insulating resin layer or the like is laminated on the metal layer in a laminating step, a surface of the resin layer 1 may be exposed from areas in which the immediately underlying layer has been removed. Therefore, the later-described insulating resin layer 6 and the resin layer 1 stick to each other, resulting in a failure to remove a group of members with the resin layer 1 as a center from a second laminate in a subsequent step.

On the other hand, in the first laminate (supporting substrate) in the present embodiment, each of layers immediately underlying the respective first metal layers 4 is a bonding layer 3, and furthermore, an intermediate layer 2 is provided as peeling means between the bonding layer 3 and the resin layer 1. Therefore, in the first laminate (supporting substrate) in the present embodiment, the bonding layer 3 is not removed together with the first metal layer 4 at the time of etching, enabling prevention of, e.g., adherence of the resin layer 1 and the insulating resin layer to each other such as mentioned above. Also, since each of the bonding layers 3 is provided with peeling means such as an intermediate layer 2, even after the first metal layer 4 is made into a first wiring conductor, the first wiring conductor and a group of members with the resin layer 1 as a center can easily be separated from the second laminate in a subsequent step.

Figure 2:
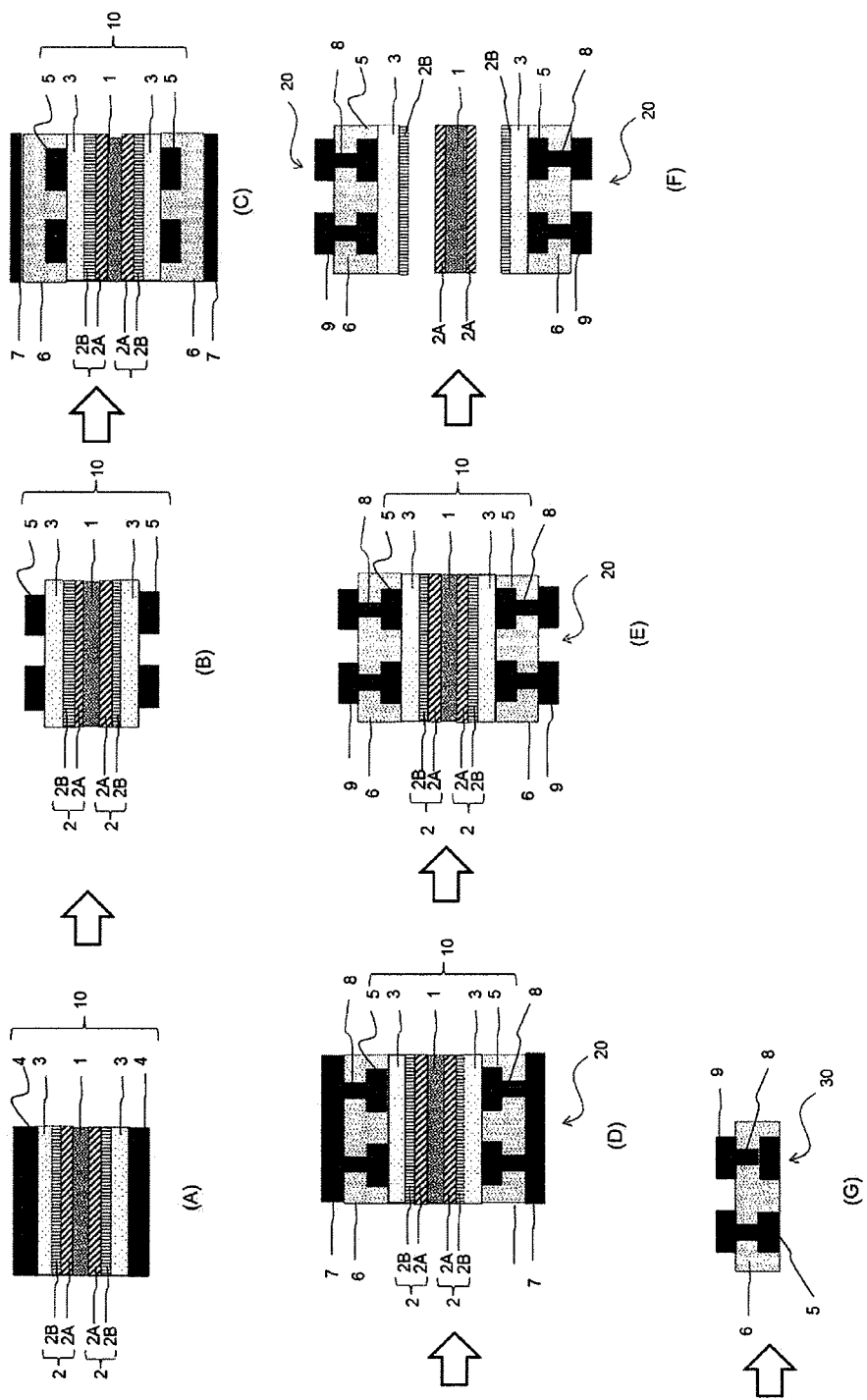
FIG. 2 includes diagrams illustrating the flow in one embodiment of the manufacturing method according to the present embodiment (mode in which a layer that includes a carrier layer and a metal film having a thickness of no more than 5 μm is used as each of intermediate layers).
Figure 3:
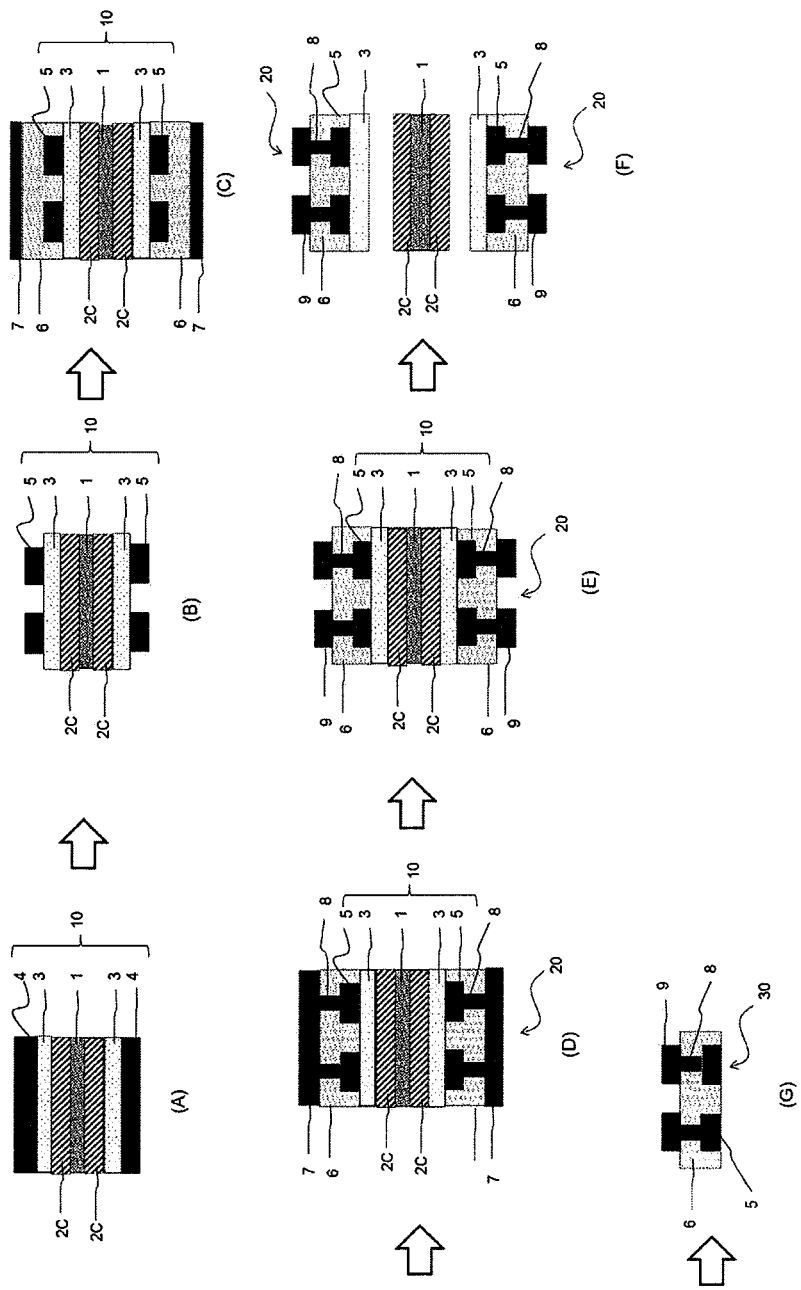
FIG. 3 includes diagrams illustrating the flow of the manufacturing method according to the present embodiment in one embodiment in which a layer including a fluorine-based resin is used as each of intermediate layers.
Figure 4:
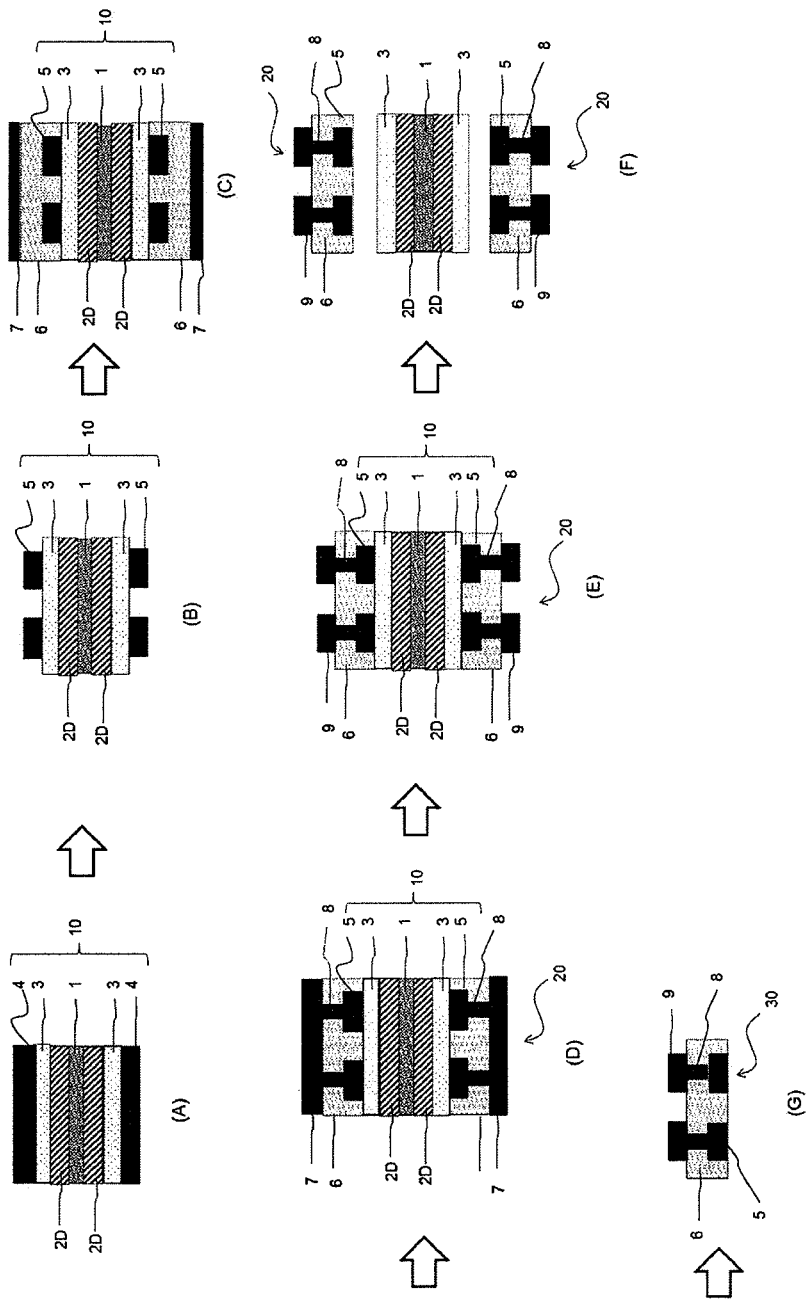
FIG. 4 includes diagrams illustrating the flow of the manufacturing method according to the present embodiment in one embodiment in which thermally expandable particles are used as peeling means.

As illustrated in FIG. 1, in the first laminate 10, opposite end portions of the resin layer 1 can include protrusion parts 1A covering opposite end portions of the intermediate layers 2 and the bonding layers 3. For example, where a later-described prepreg is used as the resin layer, each of the protrusion parts 1A is a part formed as a result of a resin in the prepreg being melted and running over during heating and pressure application. The protrusion parts 1A are not essential components for the first laminate 10 in the present embodiment; however, if the first laminate 10 includes the protrusion parts 1A, for example, a chemical used in each step can be prevented from penetrating between the intermediate layers and the bonding layers and/or between the resin layer and the respective intermediate layers. In subsequent FIGS. 2 to 4, illustration of the protrusion parts 1A is omitted.

In the first laminate preparing step, as a step in the method of manufacturing a package substrate for mounting a semiconductor device, a step of forming a first laminate may be included or a completed first laminate (in other words, a supporting substrate in the present embodiment) may be otherwise provided and the method for manufacturing a package substrate for mounting a semiconductor device according to the present embodiment may be carried out using the first laminate.

—Resin Layer—

The resin layer is a layer that serves as a carrier substrate of the first laminate and is peeled in a later-described peeling step. For the resin layer, although not specifically limited, e.g., a prepreg formed by impregnation of an insulating resin material (insulating material) such as a thermosetting resin in a normal base material such as glass cloth or an insulating film material may be used.

Here, the "prepreg" is one obtained by impregnation or application of an insulating material such as a resin composition in or to a base material.

The base material is not specifically limited and any of known ones used in various types of laminate plates for electric insulating materials can arbitrarily be used. A material of the base material is not specifically limited, but examples of the material may include, e.g., inorganic fibers such as E-glass, D-glass, S-glass and Q-glass, organic fibers such as polyimide, polyester and tetrafluoroethylene, and mixtures thereof. Also, a form of the base material is not specifically limited, but, for example, one having a form of, e.g., woven fabric, non-woven fabric, roving, a chopped strand mat or a surfacing mat can arbitrarily be used. However, a material and a form of the base material are selected according to use and/or capabilities of an intended molded product, and as necessary, a single or two or more materials and forms can be used.

There is no specific limitation on a thickness of the base material, but normally, one having a thickness of around 0.015 to 0.5 mm can be used. Also, for the base material, any of those subjected to surface treatment using, e.g., a silane coupling agent or mechanically subjected to spreading can be used, and such base materials are preferable from the perspective of heat resistance, moisture resistance and workability.

For the insulating material, a publicly known resin composition that is used as an insulating material for a printed wiring board can arbitrarily be selected and used. For the resin composition, a thermosetting resin having favorable heat and chemical resistance can be used as a base. Although the thermosetting resin is not specifically limited, examples of the thermosetting resin can include e.g., phenol resins, epoxy resins, cyanate resins, maleimide resins, isocyanate resins, benzocyclobutene resins and vinyl resins. For thermosetting resin, one kind of thermosetting resin may be used alone or a mixture of two or more kinds of thermosetting resins may be used.

From among thermosetting resins, epoxy resins have excellent heat and chemical resistance and excellent electrical characteristics and are relatively inexpensive, and thus are suitable for use as insulating resins. Examples of the epoxy resins can include, e.g., bisphenol A-based epoxy resins, bisphenol F-based epoxy resins, bisphenol S-based epoxy resins, alicyclic epoxy resins, aliphatic chain epoxy resins, phenol novolac-based epoxy resins, cresol novolac-based epoxy resins, bisphenol A novolac-based epoxy resins, diglycidyl-etherified products of biphenols, diglycidyl-etherified products of naphthalenediols, diglycidyl-etheried products of phenols, diglycidyl-etherified products of alcohols, and alkyl substitutes, halides and hydrogenated products thereof. For the epoxy resin, one kinds of epoxy resin may be used alone or a mixture of two or more kinds of epoxy resins may be used. Also, a hardening agent used together with the epoxy resin is not limited and any hardening agent can be used as long as the hardening agent hardens epoxy resins, and examples of the hardening agent can include, e.g., multifunctional phenols, multifunctional alcohols, amines, imidazole compounds, acid anhydrides, organophosphorus compounds and halides thereof. One kinds of these epoxy resin hardening agents may be used alone or a mixture of two or more kinds of the epoxy resin hardening agents may be used.

The cyanate resins are resins that upon being heated, produce a hardened material with a triazine ring as a repeating unit, and the hardened material has excellent dielectric characteristics. Therefore, the cyanate resins are favorable particularly for, e.g., cases where high frequency characteristics are required. Examples of the cyanate resins include, e.g., 2,2-bis(4-cyanatophenyl)propane, bis(4-cyanatophenyl)ethane, 2,2-bis(3,5-dimethyl-4-cyanatophenyl) methane, 2,2-(4-cyanatophenyl)-1,1,1,3,3,3-hexafluoropropane, α, α'-bis(4-cyanatophenyl)-m-diisopropylbenzene, and cyanate-esterified products of phenol novolac and alkylphenol novolac. From among the above, 2,2-bis(4-cyanatophenyl)propane provides a particularly favorable balance between dielectric characteristics and hardenability of the resulting hardened material and is inexpensive in terms of costs and thus is favorable. Also, a single kind of cyanate resins such as cyanate ester compounds may be used alone or a mixture of two or more kinds of such cyanate resins may be used. Also, the cyanate ester compounds may be partly oligomerized into trimers or pentamers in advance.

Furthermore, a hardening catalyst or a hardening accelerator can be used in combination with a cyanate resin. For the hardening catalyst, for example, any of metals such as manganese, iron, cobalt, nickel, copper and zinc can be used, and specific examples of the metals can include organometallic salts such as 2-ethyl hexanoate, octylic acid and organic metal complexes such as acetylacetone complexes. For the hardening catalyst, a single kind of hardening catalyst may be used alone or a mixture of two or more kinds of hardening catalysts may be used.

Also, for the hardening accelerator, phenols are favorable for use, and, e.g., any of monofunctional phenols such as nonylphenol and p-cumylphenol, bifunctional phenols such as bisphenol A, bisphenol F and bisphenol S and multifunctional phenols such as phenol novolac and cresol novolac may be used. For the hardening accelerator, a single kind of hardening accelerator may be used alone or a mixture of two or more kinds of hardening accelerators may be used.

The resin composition used as the insulating material can also be blended with a thermoplastic resin in consideration of, e.g., dielectric characteristics, impact resistance and film workability. Although the thermoplastic resin is not specifically limited, examples of the thermoplastic resin can include, e.g., fluorine resins, polyphenylene ethers, modified polyphenylene ethers, polyphenylene sulfides, polycarbonates, polyetherimides, polyetheretherketones, polyacrylates, polyamides, polyamide-imides and polybutadienes. For the thermoplastic resin, a single kind of thermoplastic resin may be used alone or a mixture of two or more kinds of thermoplastic resins may be used.

From among the thermoplastic resins, it is effective to use a blend of a polyphenylene ether and a modified polyphenylene ether, from the perspective of enhancement in dielectric characteristics of the resulting hardened material. Examples of the polyphenylene ether and the modified polyphenylene ether can include, e.g., poly(2,6-dimethyl-1,4-phenylene)ether, a polymer alloy of poly(2,6-dimethyl-1,4-phenylene)ether and polystyrene, a polymer alloy of poly(2,6-dimethyl-1,4-phenylene)ether and styrene-butadiene copolymer, a polymer alloy of poly(2,6-dimethyl-1,4-phenylene)ether and styrene-maleic anhydride copolymer, a polymer alloy of poly(3,6-dimethyl-1,4-phenylene)ether and polyamide and a polymer alloy of poly(2,6-dimethyl-1,4-phenylene)ether and styrene-butadiene-acrylonitrile copolymer. Also, in order to provide reactivity and polymerizability to the polyphenylene ether, a functional group such as an amine group, an epoxide group, a carboxylic group or a styryl group may be introduced to an end of a polymer chain or a functional group such as an amine group, an epoxide group, a carboxyl group, a styryl group or a methacrylate group to a side chain of a polymer chain.

From among the thermoplastic resins, a polyamide-imide resin is effective from the perspective of excellent moisture resistance and favorable adherence to metals. Raw materials of the polyamide-imide resin are not specifically limited, but examples of an acid component of the polyamide-imide resin include trimellitic anhydride and trimellitic anhydride monochlorid, and examples of an amine component of the polyamide-imide resin include, e.g., m-phenylenediamine, p-phenylenediamine, 4,4'-diaminodiphenyl ether, 4,4'-diaminodiphenyl methane, bis[4-(aminophenoxy)phenyl] sulfone, 2,2'-bis[4-(4-aminophenoxy) phenyl]propane. The polyamide-imide resin may be siloxane-modified for enhancement in drying characteristic, and in this case, siloxanediamine can be used as an amino component. For polyamide-imide resin, it is preferable to use one having a molecular weight of no less than 50,000 in consideration of film workability.

The aforementioned thermoplastic resins have been described mainly as insulating materials to be used for a prepreg; however, use of the thermoplastic resins is not limited to use as a prepreg. For example, one obtained by any of the aforementioned thermoplastic resin being used to processing to produce a film may be used as the resin layer in the present embodiment.

The resin composition used as the insulating material may be mixed with an inorganic filler. Examples of the inorganic filler can include, e.g., alumina, aluminum hydroxide, magnesium hydroxide, clay, talc, antimony trioxide, antimony pentoxide, zinc oxide, molten silica, glass powder, quartz powder, shirasu-balloon. A single kind of these inorganic fillers may be used alone or a mixture of two or more kinds of the inorganic fillers may be used.

A resin composition used as an insulating material may contain an organic solvent. For the organic solvent, e.g., any of aromatic hydrocarbon-based solvents such as benzene, toluene, xylene and trimethylbenzene, ketone-based solvents such as acetone, methyl ethyl ketone, methyl isobutyl ketone, ether-based solvents such as tetrahydrofuran, alcohol-based solvents such as isopropanol and butanol, ether alcohol solvents such as 2-methoxyethanol and 2-butoxyethanol, and amide-based solvents such as N-methylpyrrolidone, N,N-dimethylformamide and N,N-dimethylacetamide can be used as desired in combination. Here, it is preferable that an amount of solvent in varnish when a prepreg is fabricated be in a range of 40 to 80 mass % of the entire resin composition. Also, it is desirable that a viscosity of the varnish be in a range of 20 to 100 cP (20 to 100 mPa·s).

The resin composition used as the insulating material may contain a flame retardant. For the flame retardant, although not specifically limited, for example, any publicly known and conventional flame retardant from among, e.g., bromine compounds such as decabromodiphenyl ether, tetrabromobisphenol A, tetrabromophthalic anhydride and tribromophenol, phosphorus compounds such as triphenyl phosphate, trixylyl phosphate and cresyl diphenyl phosphate, metal hydroxides such as magnesium hydroxide and aluminum hydroxide, red phosphorus and a modified product thereof, antimony compounds such as antimony trioxide and antimony pentoxide, and triazine compounds such as melamine, cyanuric acid and melamine cyanurate may be used.

The resin composition used as the insulating material can further be added with the hardening agent and the hardening accelerator mentioned above and various other additives and fillers such as thermoplastic particles, a colorant, an ultraviolet non-transmitting agent, an antioxidant and a reductant, as necessary.

The prepreg can be obtained as a prepreg in a semi-cured state (B-stage state) by, for example, impregnating or applying the resin composition (including the varnish) in or to the base material so that an amount of adherence of the resin composition to the base material becomes 20 to 90 mass % in a resin content of the prepreg after drying and then heading and drying the resulting base material at a temperature of 100 to 200° C. for 1 to 30 minutes. For such prepreg, for example, a prepreg having a thickness of 0.1 mm (product name: A-IT56) manufactured by Mitsubishi Gas Chemical Company, Inc. can be used. In the first laminate preparing step in the present embodiment, for example, 1 to 20 such prepregs are piled so as to reach a desired resin layer thickness to provide a configuration in which prepregs having a thickness of 0.1 mm (product name: A-IT56) manufactured by Mitsubishi Gas Chemical Company, Inc. are disposed at opposite surfaces thereof, which can then be subjected to heating and pressure application. For a method of molding the prepreg, an ordinary technique can be employed, and, for example, a multiplaten press, a multiplaten vacuum press, continuous molding or an autoclave molding machine is used, and normally, the molding can be performed at a temperature of 100 to 250° C. under a pressure of 2 to 100 kg/cm$^2$ for heating time of 0.1 to 5 hours or can be performed under vacuum or atmospheric pressure with lamination conditions of 50 to 200° C. and 0.1 to 10 MPs using, e.g., a vacuum laminating apparatus.

—Bonding Layer—

The bonding layer is provided at least one surface side of the resin layer and includes peeling means. Although the peeling means will be described later, for example, examples of the peeling means include, e.g., an intermediate layer provided between the resin layer and the bonding layer.

In the present embodiment, the "bonding layer" means a non-metal layer that contains a resin and can be bonded to a metal layer. Also, for the resin included in the bonding layer, it is preferable to use one that is highly resistant to a chemical that when the metal layer is subjected to etching in a subsequently step, is used in a step involved in the etching. Since the bonding layer is a non-metal layer, the bonding layer is not removed together with the first wiring conductor in the etching, and thus the resin layer and the insulating resin layer are prevented from being welded to each other. Also, since the bonding layer is a non-metal layer, the bonding layer can easily be peeled or removed from the first wiring conductor in the peeling step or the removal step.

The resin included in the bonding layer is not specifically limited and, for example, may be either a thermosetting resin or a thermoplastic resin, but is preferably of an insulating material. For the insulating material, any of the thermosetting resins and the thermoplastic resins that can be used for the above-described resin layer can be used, but, for example, from the perspective of heat and chemical resistance and electrical characteristics, an epoxy resin is suitable for use. Although the epoxy resin is not specifically limited, examples of the epoxy resin can include, e.g., bisphenol A-based epoxy resins, bisphenol F-based epoxy resins, bisphenol S-based epoxy resins, alicyclic epoxy resins, aliphatic chain epoxy resins, phenol novolac-based epoxy resins, cresol novolac-based epoxy resins, bisphenol A novolac-based epoxy resins, diglycidyl-etherified products of biphenols, diglycidyl-etherified products of naphthalenediols, diglycidyl-etheried products of phenols, diglycidyl-etherified products of alcohols, and alkyl substitutes, halides and hydrogenerated products thereof. For the epoxy resin, one kinds of epoxy resin may be used alone or a mixture of two or more kinds of epoxy resins may be used. Also, a hardening agent used together with the epoxy resin is not limited and any hardening agent can be used as long as the hardening agent hardens epoxy resins, and examples of the hardening agent can include, e.g., multifunctional phenols, multifunctional alcohols, amines, imidazole compounds, acid anhydrides, organophosphorus compounds and halides thereof. One kinds of these epoxy resin hardening agents may be used alone or a mixture of two or more kinds of the epoxy resin hardening agents may be used.

—Peeling Means—

The bonding layer includes peeling means. Here, the "peeling means" means means for facilitating peeling of the bonding layer and a target layer from each other, and examples of the peeling means includes, e.g., means for facilitating peeling of the bonding layer from a target layer using a peelable intermediate layer and means for facilitating peeling of the bonding layer and a target layer from each other by lowering a force of adherence to an adjacent layer. Although not specifically limited, example modes of the peeling means are indicated below:

(1) One embodiment in which the peeling means is an intermediate layer that includes a carrier layer and a metal film having a thickness of no more than 5 μm and is provided between the bonding layer and the resin layer and the carrier layer is provided on the resin layer side;

(2) One embodiment in which the peeling means is an intermediate layer that includes a fluorine-based resin and is provided between the bonding layer and the resin layer;

(3) One embodiment in which the peeling means includes thermally expandable particles and the bonding layer includes the thermally expandable particles on the side that is an interface with the first metal layer; and (4) One embodiment in which the peeling means is an intermediate layer that includes a release layer and a metal film having a thickness of no less than 1 μm and is provided between the bonding layer and the resin layer.

Here, the intermediate layer can be used, for example, as peeling means for the bonding layer, and also can be provided for another arbitrary purpose.

For the intermediate layer including a carrier layer and a metal film having a thickness of no more than 5 μm in this order from the resin layer side, for example, a carrier metal foil-included metal foil can be used. Here, the "carrier metal foil-included metal foil" is a laminate sheet including a carrier metal foil as a carrier layer and a metal foil that is thinner than the carrier metal foil (hereinafter may be referred to as "thin metal foil"). In more detail, the carrier metal foil-included metal foil is a laminate sheet in which a thin metal foil is laminated in a peelable state on a carrier metal foil, as necessary, via another film and may be a commercially available one.

Where the intermediate layer is a laminate sheet formed by laminating of a carrier metal foil and a thin metal foil, normally, the carrier metal foil and the thin metal foil are peeled from each other. A thickness of the carrier metal foil is not specifically limited, but is preferably, 9 to 70 μm, more preferably 12 to 35 μm in consideration of handling capability and economic efficiency. A thickness of the thin metal foil is also not specifically limited, but is preferably no more than 5 μm, more preferably 1 to 5 μm, in consideration of economic efficiency and laminate productivity. A kind of metal of the thin metal foil is not specifically limited, and for example, at least one kind of metal selected from gold, silver, copper and aluminum and alloys of two or more kinds of metals from among such metals can be used. From among these metals, copper is suitable for use from the perspective of thermal expansion rate, electrical conductivity and economic efficiency.

A strength of peeling of the carrier metal foil and the thin metal foil from each other at an interface therebetween is not specifically limited, but is preferably 1 to 50 N/m, more preferably 3 to 40 N/m, further preferably 5 to 20 N/m, from the perspective of penetration of chemicals in the respective steps and suppression of uneven peeling in the peeling step. For a method for measuring the peeling strength, publicly known means can arbitrarily be used, and, for example, it is possible to perform peeling using a tensile tester or a spring scale and use a strength of the peeling at that time as a measurement value. Here, it is preferable that the strength of peeling of the carrier metal foil and the thin metal foil from each other be smaller than, e.g., a strength of bonding between the carrier metal foil and the resin layer and a strength of bonding between the thin metal foil and the bonding layer so that peeling can be performed at the interface between the carrier metal foil and the thin metal foil in the peeling step.

Although the fluorine-based resin is not specifically limited, examples of the fluorine-based resin included in the intermediate layer including a fluorine-based resin can include, e.g., polytetrafluoroethylene, polyvinylidene fluoride, polychlorotrifluoroethylene. Where the intermediate layer includes a fluorine-based resin, an (intermediate) layer including the fluorine-based resin may include another thermoplastic resin or thermosetting resin as necessary. If such other resin and the fluorine-based resin are used in combination, although not specifically limited, a content of the fluorine-based resin in the intermediate layer is preferably no less than 10 mass %, preferably no less than 50 mass %, preferably no less than 90 mass %, of the total mass of the intermediate layer. For the layer including the fluorine-based resin, although not specifically limited, for example, a commercially available Teflon (registered trademark) sheet is suitable for use.

Although not specifically limited, where an intermediate layer including a fluorine-based resin is used, a configuration can be made so that peeling is performed at an interface between the intermediate layer and the bonding layer. In this case, a strength of peeling of the intermediate layer including a fluorine-based resin and the bonding layer at an interface therebetween is not specifically limited, but preferably 1 to 100 N/m, more preferably 1 to 70 N/m, further preferably to 50 N/m, from the perspective of suppression of, e.g., uneven peeling in the peeling step. For a method for measuring the peeling strength, publicly known means can arbitrarily be used, and, for example, it is possible to perform peeling using a tensile tester or a spring scale and use a strength of the peeling at that time as a measurement value. Here, it is preferable that the strength of peeling of the intermediate layer including a fluorine-based resin and the bonding layer be smaller than, e.g., a strength of bonding between the intermediate layer and the resin layer and a strength of bonding between the bonding layer and the first wiring conductor so that peeling can be performed at the interface between the intermediate layer and the bonding layer in the peeling step.

Where the bonding layer includes thermally expandable particles as peeling means, for the thermally expandable particles, although not specifically limited, for example, microcapsules use a compound that is easily gasified and exhibits thermal expansion property (for example, isobutane, propane or pentane) as a core and using a hot melt substance or a substance that is broken by thermal expansion, for example, a vinylidene chloride-acrylonitrile copolymer, polyvinyl alcohol, polyvinyl butyral, polymethylmethacrylate, polyacrylonitrile, polyvinylidene chloride or polysulfone, as a shell can be used. A volume expansion of thermally expandable particles is not specifically limited, but can be made to be, for example, no less than 5 times. Furthermore, a temperature for expansion of the thermally expandable particles is also not specifically limited and can arbitrarily be set so that in a step in which bonding between the first metal layer and the bonding layer is desired to be maintained, a strength of the bonding is not decreased and the first metal layer and the bonding layer can be peeled from each other in a later step. Furthermore, an average particle diameter of the thermally expandable particles used can arbitrarily be set and for example, can be set to, 1 to 50 μm.

If the thermal expandable particles are included in the bonding layer as peeling means, the thermal expandable particles can be biased on the side on which a force of bonding of the bonding layer is desired to be lowered. However, the present invention is not limited to such configuration, and for example, the thermal expandable particles may be biased on the resin layer side or the thermal expandable particles may uniformly be dispersed in the bonding layer.

Where the thermal expandable particles are used, for example, a thermoplastic resin can be used as a base polymer of the bonding layer. The thermoplastic resin is a resin that upon being provided with a certain temperature, softens and exhibits plasticity and upon being cooled, solidifies, and examples of the thermoplastic resin can include, e.g., vinyl polymers such as polyethylene, polypropylene, polystyrene and polyvinyl chloride and condensation polymers such as polyester and polyamide.

If the bonding layer includes thermally expandable particles as peeling means, for example, the bonding layer may be formed by applying a composition for the bonding layer, the composition including the thermally expandable particles, onto the resin layer or, e.g., a film in which the bonding layer including thermally expandable particles is formed on a support such as a polyester film may be used. In the latter case, for example, the configuration can be made so that the support is disposed on the resin layer side as an intermediate layer and the first metal layer is disposed on the bonding layer side. For such film, a publicly known one can arbitrarily be used, but, for example, a thermal release sheet for electronic component processing (manufactured by Nitto Denko Corporation, product name: Revalpha (item number: 31950E)), which is a commercially available product including a release layer formed in a polyester base material can arbitrarily be used.

Where an intermediate layer including a release layer and a metal film having a thickness of no less than 1 μm is used as peeling means, the intermediate layer is disposed between the bonding layer and the resin layer in such a manner that the release layer is located on the bonding layer side and the metal film is located on the resin layer side. For a material included in the release layer, although not specifically limited, for example, a silicon compound such as a silane compound can be used. Furthermore, as necessary, e.g., a publicly known thermosetting resin may be used for the release layer. For such intermediate layer, for example, a commercially available release layer-included metal foil can be used.

Where a release layer-included metal foil is used as the intermediate layer, there is no specific limitation on a part to be peeled in the peeling step, but, normally, it is preferable that the bonding layer and the release layer be peeled from each other. A thickness of the release layer is not specifically limited, but is preferably 5 to 100 nm, more preferably 10 to 80 nm, particularly preferably 20 to 60 nm.

Also, a type of metal of the metal film having a thickness of no less than 1 μm that is used for the intermediate layer is not specifically limited, and for example, at least one kind of metal selected from gold, silver, copper and aluminum and alloys of two or more kinds of metals from among such metals can be used. From among these metals, copper is suitable for use from the perspective of thermal expansion rate, electrical conductivity and economic efficiency. Also, the thickness of the metal film is no less than 1 μm, and is preferably 9 to 70 μm, further preferably 12 to 35 μm, in consideration of handling capability and economic efficiency.

—First Metal Layer—

A kind of metal of the first metal layer is not specifically limited, and for example, at least one kind of metal selected from gold, silver, copper and aluminum and alloys of two or more kinds of metals from among such metals can be used. From among these metals, copper is suitable for use from the perspective of thermal expansion rate, electrical conductivity and economic efficiency.

—Thicknesses of Respective Layers—

A thickness of the first laminate can arbitrarily be set as desired and not specifically limited, but for example, is preferably 30 to 300 μm, further preferably 40 to 200 μm from the perspective of handling during laminating.

A thickness of the resin layer can arbitrarily be set as desired and not specifically limited, but, for example, is preferably no less than 1 μm, preferably, 5 to 200 μm, further preferably 5 to 100 μm from the perspective of insulation reliability.

A thickness of the intermediate layer is not specifically limited, but is preferably no less than 1 μm, preferably no more than 100 μm, more preferably 1 to 50 μm from the perspective of formation of the first wiring conductor by means of etching and the perspective of economic efficiency and productivity.

A thickness of the bonding layer is not specifically limited, but is preferably no more than 100 μm, preferably no more than 80 μm, more preferably 1 to 50 μm, from the perspective of the bonding layer being removed in a later desmear step.

A thickness of the first metal layer is not specifically limited, but is preferably no more than 100 μm, preferably no more than 20 μm, more preferably 5 to 20 μm, from the perspective of the first wiring conductor being formed by means of etching and the perspective of economic efficiency and productivity.

[First Wiring Forming Step]

The first wiring forming step is a step of forming a first wiring conductor in the first laminate by etching the first metal layer.

A method for forming a first wiring conductor by etching the first metal layer is not specifically limited, but for example, includes a step of laminating a resist on the first metal layer of the first laminate, a step of forming a wiring circuit pattern on the first metal layer by developing the resist via photolithography and a step of forming a first wiring conductor on the bonding layer by patterning the first metal layer using an etching liquid and removing the wiring circuit pattern on the patterned first metal layer (what is called "subtractive process"), which enables a first wiring conductor to be formed from the first metal layer. A method for forming a first wiring conductor by means of the subtractive process is not specifically limited, and a publicly known method normally performed in manufacture of a multilayer printed wiring board can be used.

The aforementioned resist is not specifically limited, and for example, a publicly known one such as a commercially available dry film resist can arbitrarily be selected and used. Also, conditions, etc., for the photolithography (including exposure, development and resist removal) in formation of a wiring circuit pattern are not specifically limited, and the photolithography can be performed using publicly known means and apparatus.

A pattern width of the first wiring conductor is not specifically limited and can arbitrarily be selected according to use, but for example, can be made to be 5 to 100 μm, preferably around 10 to 30 μm.

For example, although not specifically limited, formation of a first wiring conductor from the first metal layer by means of the subtractive process can be performed as follows. First, the copper foil (metal layer) surface is etched 1 to 2 μm deep using a persulfate-type soft etching liquid such as CZ-8100 (product name) manufactured by MEC Co., Ltd. (roughening), and next, a dry film (RD-1225 manufactured by Hitachi Chemical Company, Ltd.) is laminated on the resulting copper foil surface at a temperature of 110±10° C. under pressure of 0.50±0.02 MPa. Next, the dry film resist is exposed with reference to a positioning hole using a mask exposure machine, and the dry film resist is developed using a 1% sodium carbonate aqueous solution and subsequently, the copper foil in parts not covered by the etching resist is removed using a copper chloride aqueous solution, and lastly, the dry film resist is peeled using an amine-based resist peeling liquid, whereby a first wiring conductor can be formed.

[Second Laminate Forming Step]

The second laminate forming step is a step of forming a second laminate by laminating an insulating resin layer and a second metal layer in this order on a surface of the first laminate, the surface being provided with the first wiring conductor. Also, in the second laminate forming step, the first wiring conductor is subjected to roughening treatment, and the insulating resin layer and the second metal layer are laminated in this order on the surface provided with the first wiring conductor subjected to roughening treatment, via heating and pressure application. The roughening enables enhancement in strength of bonding between the first wiring conductor and the insulating resin. For the roughening, a publicly known method can arbitrarily be used, but for example, roughening in which e.g., oxidation, reduction or etching is performed can be employed.

(Insulating Resin Layer)

For the insulating resin layer, a material that is similar to that of the above-described resin layer (for example, a prepreg) can be used. Also, a thickness of the insulating resin layer can arbitrarily be set as desired and is not specifically limited, but is preferably 5 to 100 μm, further preferably 20 to 90 μm, from the perspective of insulation reliability.

(Second Metal Layer)

For the second metal layer, for example, a metal that is similar to that of the above-described first metal layer or ultrathin copper foil can be used. For the second metal layer, for example, a carrier-included ultrathin copper foil can be used. In this case, the carrier is peeled after an ultrathin copper foil surface being disposed on the insulating resin layer and laminated on the insulating resin layer via heating and pressure application, and the ultrathin copper foil after the peeling of the carrier is a second metal layer.

A method for heating and pressure application after disposition of the insulating resin layer and the second metal layer on the surface provided with the first wiring conductor is not specifically limited, but for example, examples of the method can include publicly known means such as vacuum (reduced-pressure) hot pressing and vacuum (reduced-pressure) lamination.

For example, where a prepreg is used as the insulating resin layer, it is suitable to employ vacuum (reduced-pressure) hot pressing from the perspective of further enhancement in bonding strength. A heating temperature in the heating and pressure application is not specifically limited, but is preferably 160 to 230° C., further preferably 180 to 220° C. from the perspective of further enhancement in bonding strength. Also, a pressure of the pressure application is also not specifically limited, but preferably 1 to 4 MPa, further preferably 2.5 to 3.5 MPa from the perspective of further enhancement in bonding strength. Furthermore, time of the heating and pressure application is not specifically limited, but for example, is preferably 60 to 300 minutes, further preferably 120 to 180 minutes from the perspective of further enhancement in bonding strength. However, the heating temperature, the pressure of the pressure application and the time of the heating and pressure application are arbitrarily determined according to the material used.

[Second Wiring Forming Step]

The second wiring forming step is a step of forming a second wiring conductor on the insulating resin layer by forming a non-through hole in the insulating resin layer, the non-through hole extending to the first wiring conductor, and subjecting the insulating resin layer with the non-through hole formed therein to electrolytic plating and/or electroless plating. Although not specifically limited, for example, in the second wiring forming step, it is possible that: an inner wall of the non-through hole is connected via the electrolytic plating and/or the electroless plating; and the second wiring conductor is formed via the subtractive process or a semi-additive process. Here, although not specifically limited, for a method for forming the second wiring conductor, it is preferable to use the subtractive process from the perspective of the number of steps and yield enhancement.

(Non-Through Hole)

Means for forming the non-through hole is not specifically limited, but for example, publicly known means, such as a laser, like a carbon dioxide laser, or a drill can be used. The non-through hole is formed in the insulating resin layer via the metal layer, and is provided to electrically connect the second wiring conductor formed in the present step and the first wiring conductor. The number and a size of non-through holes can arbitrarily be determined as desired. Also, after the formation of the non-through hole, the non-through hole can be subjected to desmear using, e.g., a sodium permanganate aqueous solution.

In the second wiring forming step, after the formation of the non-through hole, the non-through hole is subjected to electrolytic copper plating and/or electroless copper plating to form a copper film on the inner wall of the non-through hole to thereby electrically connect the first wiring conductor and the second metal layer. For the electrolytic copper plating and/or electroless plating, a known method can be employed. For the copper plating, only one of electrolytic copper plating and electroless plating may be performed, but it is preferable that both electrolytic copper plating and electroless plating be performed.

(Formation of Second Wiring Conductor)

In the second wiring forming step, a second wiring conductor is formed after the electrolytic plating and/or the electroless plating. A method for forming a second wiring conductor is not specifically limited, and publicly known means such as the subtractive process or the semi-additive process can arbitrarily be employed. The subtractive process in the second wiring forming step is not specifically limited, but for example, surface conditioning of the second metal layer are performed, e.g., a dry film resist is laminated thereon, and furthermore, a negative mask is attached thereto, and then a circuit pattern is printed by means of an exposure machine, and the dry film resist is developed using a developer, whereby an etching resist can be formed. Subsequently, etching is performed, and the metal (for example, copper) in parts in which the etching resist is not provided is removed using, e.g., a ferric chloride aqueous solution and then the resist is removed, whereby a second wiring conductor can be formed.

[Peeling Step]

The peeling step is a step of peeling at least the resin layer from the second laminate with the second wiring conductor formed therein. For means for peeling the resin layer, either physical means or chemical means can be employed, but, for example, it is preferable to physically peel the first resin layer by applying a physical force to a boundary surface to be peeled. In the peeling step, at least the resin layer is peeled from the second laminate with the second wiring conductor therein, whereby a package substrate for mounting a semiconductor device according to the present embodiment can be fabricated. In the present embodiment, a boundary surface of a layer to be peeled in the peeling step is different depending on the type of the peeling means used.

The peeling step can include a step of removing at least one of the intermediate layer and the bonding layer from the second laminate with at least the resin layer peeled therefrom (removal step). Also, in the peeling step, at least one of the intermediate layer and the bonding layer can be removed using an etching liquid or a desmear liquid. Furthermore, in the peeling step, at least one of the intermediate layer and the bonding layer may be removed via plasma treatment. For the removal of the intermediate layer or the bonding layer, publicly known means can arbitrarily be employed according to the material used. A plasma apparatus used for the plasma treatment is not specifically limited, but, e.g., March Plasma Systems, Inc.'s model number PCB1600E can be used. Also, although not specifically limited, for the plasma treatment, for example, a fluorine gas such as carbon tetrafluoride can be used.

[Flow of the Manufacturing Method According to the Present Embodiment]

The flow of the manufacturing method according to the present embodiment will be described below with reference to the drawings.

First, one embodiment in which intermediate layers are used as peeling means for bonding layers and a layer that includes a carrier layer and a metal film having a thickness of no more than 5 μm is used as each of the intermediate layers will be described with reference to FIG. 2. FIG. 2 includes diagrams illustrating the flow in one embodiment of the manufacturing method according to the present embodiment (mode in which a layer that includes a carrier layer and a metal film having a thickness of no more than 5 μm is used as each of intermediate layers).

As illustrated in FIG. 2(A), in the first laminate preparing step, a first laminate 10 including a resin layer 1, and an intermediate layer 2, a bonding layer 3 and a first metal layer 4 on each of opposite surfaces of the resin layer 1 is prepared. In FIG. 2(A), each of the intermediate layers 2 has a structure in which a carrier layer 2A and an ultrathin copper foil layer 2B having a thickness of no more than 5 μm are laminated from the resin layer 1 side. Here, the first laminate 10 illustrated in FIG. 2(A) corresponds to the supporting substrate according to the present embodiment including a resin layer 1, an intermediate layer 2 provided on at least one surface of the resin layer 1, a bonding layer 3 provided on the intermediate layer 2, and a metal layer (first metal layer 4) provided on the bonding layer 3.

As illustrated in FIG. 2(B), in the first wiring forming step, the first metal layers 4 are etched to form respective first wiring conductors 5 in the first laminate 10. As described above, each first wiring conductor 5 can be formed through a step of laminating a resist on the relevant first metal layer 4 of the first laminate 10, a step of forming a wiring circuit pattern on the first metal layer 4 by developing the resist via photolithography and a step of forming a first wiring conductor 5 on the bonding layer 3 by subjecting the first metal layer 4 with the wiring circuit pattern formed thereon to the subtractive process.

As illustrated in FIG. 2(C), in the second laminate forming step, an insulating resin layer 6 and a second metal layer 7 are laminated in this order on each of the surfaces, with the respective first wiring conductors 5 provided, of the first laminate 10 to form a second laminate 20. In the second laminate forming step, the first wiring conductors 5 are subjected to roughening to provide the roughened first wiring conductors 5, enabling enhancement in strength of bonding between the first wiring conductors 5 and the respective insulating resin layers 6. After the roughening, the insulating resin layers 6 and the second metal layers 7 are laminated in this order on the respective first wiring conductors 5 via heating and pressure application. Here, the second laminate 20 illustrated in FIG. 2(D) corresponds to the supporting substrate-attached laminate according to the present embodiment including a resin layer 1, an intermediate layer 2 provided on at least one surface of the resin layer 1, a bonding layer 3 provided on the intermediate layer 2, an insulating resin layer 6 provided on the bonding layer 3, a first wiring conductor (metal layer) 5 embedded in the insulating resin layer 6, and a second metal layer 7 provided on the insulating resin layer 6.

As illustrated in FIG. 2(D), in the second wiring forming step, first, non-through holes 8 extending to the relevant first wiring conductor 5 are formed in each of the insulating resin layers 6. As described above, the non-through holes 8 can be formed by, for example, a laser or the like. Also, after the formation of the non-through holes 8, the non-through holes 8 are subjected to desmear as desired. Next, the insulating resin layers 6 with the non-through holes 8 formed therein are subjected to electrolytic plating and/or electroless plating, whereby an inner wall of each of the non-through holes is connected and the first wiring conductor 5 and the second metal layer 7 are thus electrically interconnected. Although the present embodiment is configured in such a manner that the first wiring conductor 5 and the second metal layer 7 are electrically connected, the present invention is not limited to that embodiment, and it is not necessary that the first wiring conductor 5 and the second metal layer 7 be electrically interconnected via all of the non-through holes, and there may be a non-through hole via which the first wiring conductor 5 and the second metal layer 7 are not electrically interconnected.

Next, as illustrated in FIG. 2(E), in the second wiring forming step, for example, a second wiring conductor 9 is formed by means of the subtractive process or a semi-additive process. Although not specifically limited, the subtractive process is preferable for a method for forming the second wiring conductor 9 from the perspective of the number of steps and yield enhancement. As described later, where a package substrate for mounting a semiconductor device having a built-up structure is formed, steps that are the same as the second laminate forming step and the second wiring forming step are further repeated n times for the second laminate 20 with the second wiring conductors 9 formed on the respective insulating resin layers 6 by the second wiring forming step. Consequently, a second laminate 20 having a built-up structure including (n+2)-layer wiring conductors.

As illustrated in FIG. 2(F), in the peeling step, at least the resin layer 1 is peeled from the second laminate 20 with the second wiring conductors 9 formed therein. In FIG. 2(F), the second laminate 20 is configured so as to be peeled at respective boundary surfaces between the respective carrier layers 2A and the respective ultrathin copper foil layers 2B provided on the opposite surfaces of the resin layer 1. In the present embodiment, the respective layers are laminated on each of the opposite surfaces of the resin layer 1, and thus two package substrate for mounting a semiconductor device can be obtained from one second laminate 20.

As illustrated in FIG. 2(G), in the removal step, the bonding layers 3 and the ultrathin copper foil layers 2B, which are remaining parts of the intermediate layers, are removed from the second laminate 20 with the resin layer 1 and the carrier layer 2A peeled therefrom. For the removal of the ultrathin copper foil layers 2B and the bonding layers 3, the above-described etching liquid or desmear liquid can be used.

Through the above steps, package substrate for mounting semiconductor devices 30 according to the present embodiment can be obtained. The manufacturing method according to the present embodiment enables a package substrate for mounting a semiconductor device 30 to be easily formed with a good yield without using the plating patterning process.

Next, the flow of the manufacturing method according to the present embodiment in one embodiment in which intermediate layers are used as peeling means for respective bonding layers and a layer including a fluorine-based resin is used as each of the intermediate layers will be described. FIG. 3 includes diagrams illustrating the flow of the manufacturing method according to the present embodiment in one embodiment in which a layer including a fluorine-based resin is used as each of intermediate layers. Here, members that overlap those in the steps in FIG. 2 are provided with numerals that are the same as those in FIG. 2 and description of steps that are similar to those in FIG. 2 will be omitted.

As illustrated in FIG. 3(A), in the first laminate preparing step, a first laminate 10 including a resin layer 1, and an intermediate layer 2C, a bonding layer 3 and a first metal layer 4 on each of opposite surfaces of the resin layer 1 is prepared. In FIG. 3(A), as each of intermediate layers, an intermediate layer 2C including a fluorine-based resin, such as, for example, a Teflon (registered trademark) sheet, is used.

Where an intermediate layer 2C including a fluorine-based resin is used as each of intermediate layers, as illustrated in FIG. 3(F), in the peeling step, a second laminate 20 is configured so as to be peeled at respective boundary surfaces between the respective intermediate layers 2C and the respective bonding layers 3 provided on the opposite surfaces of the resin layer 1.

As illustrated in FIG. 3(G), in the removal step, the bonding layers 3 are removed from the second laminate 20 with the resin layer 1 and the intermediate layers 2C peeled therefrom. For the removal of the bonding layers 3, the above-described desmear liquid or plasma treatment can be used.

Through the above steps, package substrate for mounting semiconductor devices 30 according to the present embodiment can be obtained. The manufacturing method according to the present embodiment also enables a package substrate for mounting a semiconductor device 30 to be easily formed with a good yield without using the plating patterning process.

Next, the flow of the manufacturing method according to the present embodiment in one embodiment in which thermally expandable particles are used as peeling means (mode in which thermal release sheets are used) will be described. In the present mode, each of the thermal release sheets includes a bonding layer containing thermally expandable particles and a support, and the supports serve as respective intermediate layers in FIG. 4. FIG. 4 includes diagrams illustrating the flow of the manufacturing method according to the present embodiment in one embodiment in which thermally expandable particles are used as peeling means. Here, members that overlap those in the steps in FIG. 2 are provided with numerals that are the same as those in FIG. 2 and description of steps that are similar to those in FIG. 2 will be omitted.

As illustrated in FIG. 4(A), in the first laminate preparing step, a first laminate 10 including a resin layer 1, and an intermediate layer 2D, a bonding layer 3 and a first metal layer 4 on each of opposite surfaces of the resin layer 1 is prepared. In FIG. 4(A), thermally expandable particles, illustration of which is omitted, are contained in each of the bonding layers 3. Also, the thermally expandable particles are biased on the first metal layer 4 side of each bonding layer 3. Also, as an intermediate layer, the support of the thermal release sheet is used as it is, for each intermediate layer 2D.

As described above, where thermally expandable particles are used as peeling means, as illustrated in FIG. 4(F), in the peeling step, a second laminate 20 is configured so as to be peeled at respective boundary surfaces between the respective bonding layers 3 and respective first wiring conductors 5 provided on the opposite sides of the resin layer 1. In FIG. 4, the bonding layers 3 are peeled together with the resin layer 1, and thus there is no need to perform the removal step. However, for example, the bonding layers 3 possibly partly remain on surfaces of the first wiring conductors 5, and thus, the removal step may arbitrarily be performed using the above-described desmear liquid or plasma treatment.

Through the above steps, package substrate for mounting semiconductor devices 30 according to the present embodiment can be obtained. The manufacturing method according to the present embodiment also enables a package substrate for mounting a semiconductor device 30 to be easily formed with a good yield without using the plating patterning process.

Figure 5:
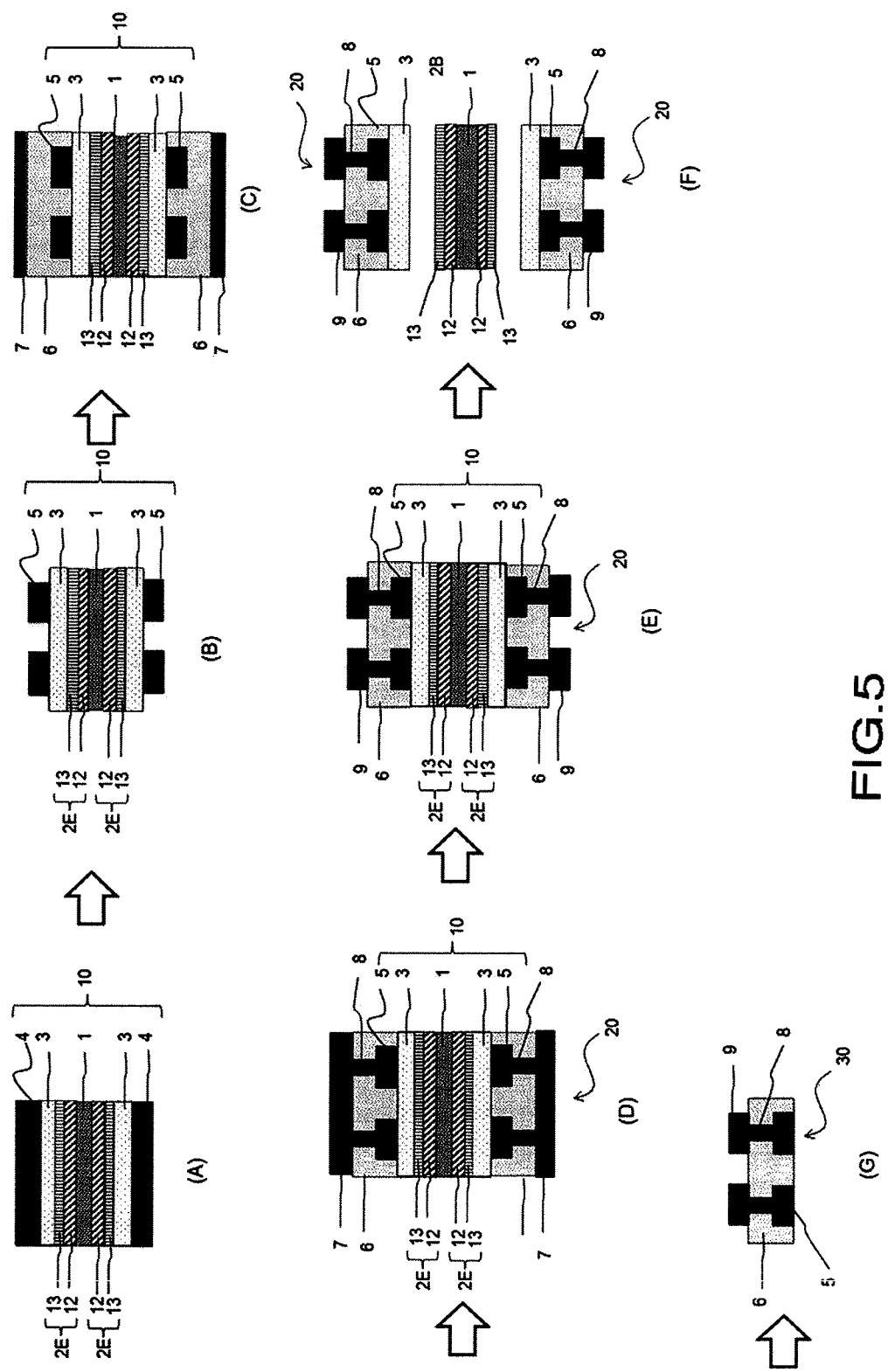
FIG. 5 includes diagrams illustrating the flow of the manufacturing method according to the present embodiment in one embodiment in which release layer-attached copper foils are used as peeling means.

Next, the flow of the manufacturing method according to the present embodiment in one embodiment in which intermediate layers are used as peeling means and a laminate of a release layer and a metal film having a thickness of no less than 1 μm is used as each of the intermediate layers will be described. This mode will be described taking a case where a release layer-attached copper foil including a release layer containing a silicon compound is used as each of the intermediate layers, as an example. FIG. 5 includes diagrams illustrating the flow of the manufacturing method according to the present embodiment in one embodiment in which a release layer-attached copper foil is used as peeling means. Here, members that overlap those in the steps in FIG. 2 are provided with numerals that are the same as those in FIG. 2 and description of steps that are similar to those in FIG. 2 will be omitted.

As illustrated in FIG. 5(A), in the first laminate preparing step, a first laminate 10 including a resin layer 1, an intermediate layer 2E, a bonding layer 3 and a first metal layer 4 on each of opposite surfaces of the resin layer 1 is prepared. In FIG. 5(A), each intermediate layer 2E has a structure in which a copper foil 12 having a thickness of no more than 1 μm and a release layer 13 are laminated from the resin layer 1 side. Here, the first laminate 10 illustrated in FIG. 5(A) corresponds to the supporting substrate according to the present embodiment including a resin layer 1, an intermediate layer 2E provided on at least one surface of the resin layer 1, a bonding layer 3 provided on the intermediate layer 2E, and a metal layer (first metal layer 4) provided on the bonding layer 3.

Where a release layer-attached copper foil including a release layer containing a silicon compound is used as peeling means as described above, as illustrated in FIG. 5(F), a second laminate 20 is configured so as to be peeled at respective boundary surfaces between the respective bonding layers 3 and the respective release layers 13 in the peeling step. Next, as illustrated in FIG. 5(G), in the removal step, the bonding layers 3 are removed from the second laminate 20 with the resin layer 1 and the intermediate layers 2E peeled therefrom. For the removal of the bonding layers 3, the above-described desmear liquid can be used.

Through the above steps, package substrate for mounting semiconductor devices 30 according to the present embodiment can be obtained. The manufacturing method according to the present embodiment also enables a package substrate for mounting a semiconductor device 30 to be easily formed with a good yield without using the plating patterning process.

[Laminate Having a Built-Up Structure]

As described above, the manufacturing method according to the present embodiment enables fabrication of a package substrate for mounting a semiconductor device having a built-up structure. For example, a package substrate for mounting a semiconductor device having a built-up structure can be fabricated by further repeating steps that are the same as the second laminate forming step and the second wiring forming step n times for the second laminate with second wiring conductors formed on respective insulating resin layers by the second wiring forming step to form a n-th laminate having a built-up structure including (n+2)-layer wiring conductors and peeling a resin layer off from the n-th laminate in the peeling step.

Figure 6:
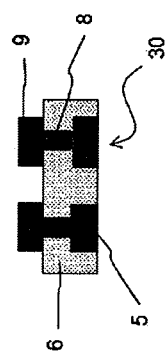
FIG. 6 include diagrams illustrating package substrate for mounting semiconductor devices having a built-up structure.
Figure 6:
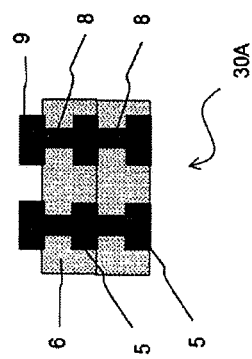
Figure 6:
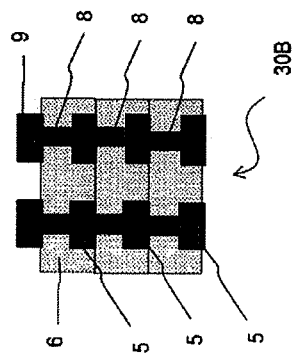

Examples of the package substrate for mounting a semiconductor device having a built-up structure can include package substrate for mounting semiconductor devices 30A and 30B, which are illustrated in FIG. 6.

Although an embodiment of the present invention has been described in detail above, the present invention is not limited to the above-described embodiment.

EXAMPLES

Examples of the manufacturing method according to the present invention will be described in detail below.

Example 1

(First Laminate Preparing Step)

As the first laminate preparing step (hereinafter may be referred to as "step 1"), a carrier-included ultrathin copper foil (manufactured by Mitsui Mining & Smelting Co., Ltd., product name: MTEx, carrier thickness: 18 μm, ultrathin copper foil thickness: 3 μm) with a bonding layer (thickness: 3 μm) provided in advance on an ultrathin copper foil-side surface by application and drying of an epoxy resin was put on each of opposite surfaces of a prepreg having a thickness of 0.1 mm (resin layer, manufactured by Mitsubishi Gas Chemical Company, Inc., product name: A-IT56) in such a manner that a carrier copper foil surface is in contact with the prepreg. In the present example, as the peeling means, the "carrier-included ultrathin copper foils" were used for intermediate layers. Furthermore, a copper foil (first metal layer, manufactured by Mitsui Mining & Smelting Co., Ltd., product name: 3EC-VLP, thickness: 12 μm) was disposed on each of the opposite sides (bonding layer surfaces) and was then pressed under vacuum and a press pressure of 3 MPa at a temperature of 220° C. for 60 minutes to fabricate a first laminate (hereinafter may be referred to as "supporting substrate").

(First Wiring Forming Step)

As the first wiring forming step (hereinafter may be referred to as "step 2"), a photosensitive dry film resist (manufactured by Hitachi Chemical Co., Ltd., product name: RD-1225) was laminated on each of opposite surfaces of the supporting substrate fabricated in step 1. Subsequently, the photosensitive dry film resist was exposed and developed along a predetermined circuit pattern, and furthermore, etching and resist peeling were performed to form a first wiring conductor (hereinafter may be referred to as "first circuit pattern layer") on each of the surfaces of the substrate. Time taken for the pattern formation in the present step was around five minutes.

(Second Laminate Forming Step)

As the second laminate forming step (hereinafter may be referred to as "step 3"), first, in order to increase a strength of bonding between the first circuit pattern layers and respective prepregs laminated in the present step, roughening of the surface copper of the first circuit pattern layers was performed using Clean Etch EMR-5100 manufactured by Mitsubishi Gas Chemical Company, Inc. Next, a prepreg having a thickness of 0.080 mm (insulating resin layer, manufactured by Mitsubishi Gas Chemical Company, Inc., product name: SH65) and a carrier-included ultrathin copper foil (manufactured by Mitsui Mining & Smelting Co., Ltd., product name: MT18Ex, carrier thickness: 18 μm, ultrathin copper foil thickness: 2 μm) were disposed on each of the opposite surfaces, with the respective first circuit pattern layers formed, of the supporting substrate in such a manner that a carrier copper foil surface becomes an outermost layer, and then pressed under vacuum and a press pressure of 3 MPa at a temperature of 220° C. for 120 minutes.

Next, positioning holes were formed using an X-ray drilling apparatus. Subsequently, the carrier copper foil at each of the outermost layers of the substrate was physically peeled to form a second laminate. Each of the ultrathin copper foils after the peeling of the respective carrier copper foils corresponds to the second metal layer.

(Second Wiring Forming Step)

As the second wiring forming step (hereinafter may be referred to as "step 4"), first, non-through holes each having a diameter of 100 μm and extending to the relevant first circuit pattern layers of the supporting substrate were formed using a carbon dioxide gas laser processing machine (manufactured by Mitsubishi Electric Corporation, ML605GTWIII-H). In order to remove smear in the non-through holes, desmear was performed. The desmear was performed by first immersing and thereby swelling the substrate in a desmear swelling liquid, PTH-B103, manufactured by Okuno Chemical Industries Co., Ltd. at 65° C. for 5 minutes, then immersing the substrate in a desmear treatment liquid, PTH1200+PTH1200NA, manufactured by Okuno Chemical Industries Co., Ltd. at 80° C. for 8 minutes and lastly immersing the substrate in a desmear neutralization liquid, PTH-B303, manufactured by Okuno Chemical Industries Co., Ltd. at 45° C. for 5 minutes.

Next, a plating layer having a thickness of 0.4 to 0.8 μm was formed by means of electroless plating, and then a plating layer of 15 to 30 μm was formed by means of electrolytic plating. Consequently, the supporting substrate and the outer layers (second metal layers) were electrically interconnected through the plated parts of the respective non-through holes.

Subsequently, a second wiring conductor (hereinafter may be referred to as "second circuit pattern layer") was formed on each of the surfaces of the substrate by means of the subtractive process in which a photosensitive dry film resist (manufactured by Hitachi Chemical Co., Ltd., product name: RD-1225) is laminated on each of the surfaces and then exposed and developed along a predetermined circuit pattern in alignment with the above-described positioning holes and etching and resist peeling are then performed.

(Peeling Step)

As the peeling step (hereinafter may be referred to as "step 5"), the resin layer was peeled from the second laminate, together with the carrier copper foil, by applying a physical force to a boundary portion between the carrier copper foil and the ultrathin copper foil of each of the carrier-included ultrathin copper foils with the respective bonding layers formed thereon, the carrier-included ultrathin copper foils being laminated by pressing in step 1 above. Subsequently, the ultrathin copper foils were removed by means of a persulfate-type soft etching liquid, and resin (bonding layers) remaining on surfaces of the second laminate was removed by means of a desmear treatment liquid to obtain a package substrate for mounting a semiconductor device (semiconductor device mounting substrate).

Example 2

(First Laminate Preparing Step)

As step 1, a Teflon (registered trademark) film (thickness: 100 μm) with a bonding layer (thickness: 3 μm) provided in advance by application and drying of an epoxy resin was attached to each of opposite surfaces of a prepreg having a thickness of 0.1 mm (resin layer, manufactured by Mitsubishi Gas Chemical Company, Inc., product name: A-IT56) in such a manner that a Teflon (registered trademark) film surface is in contact with the prepreg. Next, a copper foil (first metal layer, manufactured by Mitsui Mining & Smelting Co., Ltd., product name: 3EC-VLP, thickness: 12 μm) was disposed on each of the opposite sides (bonding layer surfaces) and was then pressed under vacuum and a press pressure of 3 MPa at a temperature of 160° C. for 60 minutes to fabricate a supporting substrate (first laminate). In the present example, as the peeling means, the "Teflon (registered trademark) films" were used for intermediate layers.

(First Wiring Forming Step)

As step 2, a photosensitive dry film resist (manufactured by Hitachi Chemical Co., Ltd., product name: RD-1225) was laminated on each of opposite surfaces of the supporting substrate fabricated in step 1. Subsequently, the photosensitive dry film resist was exposed and developed along a predetermined circuit pattern, and furthermore, etching and resist peeling were performed to form a circuit pattern layer (first wiring conductor) at each of the surfaces of the substrate.

(Second Laminate Forming Step)

Subsequently, as step 3, first, in order to increase a strength of bonding between the first circuit pattern layers and prepregs laminated in the present step, roughening of the surface copper of the first circuit pattern layers was performed using Clean Etch EMR-5100 manufactured by Mitsubishi Gas Chemical Company, Inc. Next, a prepreg having a thickness of 0.080 mm (insulating resin layer, manufactured by Mitsubishi Gas Chemical Company, Inc., product name: SH65) and a carrier-included ultrathin copper foil (manufactured by Mitsui Mining & Smelting Co., Ltd., product name: MT18Ex, carrier thickness: 18 μm, ultrathin copper foil thickness: 2 μm) were disposed on each of the opposite surfaces, with the respective first circuit pattern layers formed, of the supporting substrate in such a manner that a carrier copper foil surface becomes an outermost layer, and then pressed under vacuum and a press pressure of 3 MPa at a temperature of 160° C. for 120 minutes.

Next, positioning holes were formed using an X-ray drilling apparatus. Subsequently, the carrier copper foil at each of the outermost layers of the substrate was physically peeled to form a second laminate. Each of the ultrathin copper foils after the peeling of the respective carrier copper foils corresponds to the second metal layer.

(Second Wiring Forming Step)

As step 4, first, non-through holes each having a diameter of 100 μm and extending to the respective first circuit pattern layers of the supporting substrate were formed using a carbon dioxide gas laser processing machine (manufactured by Mitsubishi Electric Corporation, ML605GTWIII-H). In order to remove smear in the non-through holes, desmear was performed. The desmear was performed by first immersing and thereby swelling the substrate in a desmear swelling liquid, PTH-B103, manufactured by Okuno Chemical Industries Co., Ltd. at 65° C. for 5 minutes, then immersing the substrate in a desmear treatment liquid, PTH1200+PTH1200NA, manufactured by Okuno Chemical Industries Co., Ltd. at 80° C. for 8 minutes and lastly immersing the substrate in a desmear neutralization liquid, PTH-B303, manufactured by Okuno Chemical Industries Co., Ltd. at 45° C. for 5 minutes.

Next, a plating layer having a thickness of 0.4 to 0.8 μm was formed by means of electroless plating, and then a playing layer of 15 to 30 μm was formed by means of electrolytic plating. Consequently, the supporting substrate and the outer layers (second metal layers) were electrically interconnected through the plated parts of the respective non-through holes.

Subsequently, a second circuit pattern layer (second wiring conductor) was formed on each of the surfaces of the substrate by means of the subtractive process in which a photosensitive dry film resist (manufactured by Hitachi Chemical Co., Ltd., product name: RD-1225) is laminated on each of the subfaces and then exposed and developed along a predetermined circuit pattern in alignment with the above-described positioning holes and etching and resist peeling are then performed.

(Peeling Step)

Next, as step 5, the resin layer was peeled from the second laminate, together with the Teflon (registered trademark) film, by applying a physical force to a boundary portion between the bonding layer and the Teflon (registered trademark) film of each of the bonding layer-included Teflon (registered trademark) films laminated by pressing in step 1 above. Furthermore, resin (bonding layers) remaining on surfaces of the second laminate was removed by means of a desmear treatment liquid to obtain a package substrate for mounting a semiconductor device (semiconductor device mounting substrate).

Example 3

(First Laminate Preparing Step)

As step 1, a thermal release sheet for electronic component processing (manufactured by Nitto Denko Corporation, product name: Revalpha (item number: 31950E), (thickness: 96 μm)) was attached to each of opposite surfaces of a prepreg having a thickness of 0.1 mm (resin layer, manufactured by Mitsubishi Gas Chemical Company, Inc., product name: A-IT56). The thermal release sheets for electronic component processing each include a bonding layer and a support (intermediate layer) and contain thermally expandable particles. In the present example, each of the bonding layers in the thermal release sheets for electronic component processing corresponds to the bonding layer in the present invention. Also, each of the thermal release sheets for electronic component processing attached to the prepreg in such a manner that the intermediate layer side is in contact with the prepreg. Next, a copper foil (manufactured by Mitsui Mining & Smelting Co., Ltd., product name: 3EC-VLP, thickness: 12 μm) was disposed on each of the opposite sides (bonding layer surfaces) and was then pressed under vacuum and a press pressure of 3 MPa at a temperature of 160° C. for 60 minutes to fabricate a supporting substrate.
(First Wiring Forming Step)

As step 2, a photosensitive dry film resist (manufactured by Hitachi Chemical Co., Ltd., product name: RD-1225) was laminated on each of opposite surfaces of the supporting substrate fabricated in step 1. Subsequently, the photosensitive dry film resist was exposed and developed along a predetermined circuit pattern, and furthermore, etching and resist peeling were performed to form a circuit pattern layer (first wiring conductor) at each of the surfaces of the substrate.
(Second Laminate Forming Step)

Subsequently, as step 3, first, in order to increase a strength of bonding between the circuit pattern layers of the supporting substrate and prepregs laminated in the present step, roughening of the surface copper of the first circuit pattern layers was performed using Clean Etch EMR-5100 manufactured by Mitsubishi Gas Chemical Company, Inc. Next, a prepreg having a nominal thickness of 0.080 mm (insulating resin layer, manufactured by Mitsubishi Gas Chemical Company, Inc., product name: SH65) and a carrier-included ultrathin copper foil (manufactured by Mitsui Mining & Smelting Co., Ltd., product name: MT18Ex, thickness: 2 μm) were disposed on each of the opposite surfaces, with the respective first circuit pattern layers formed, of the supporting substrate in such a manner that a carrier copper foil surface becomes an outermost layer, and then pressed under vacuum and a press pressure of 3 MPa at a temperature of 160° C. for 120 minutes.

Next, positioning holes were formed using an X-ray drilling apparatus. Subsequently, the carrier copper foil at each of the outermost layers of the substrate was physically peeled to form a second laminate. Each of the ultrathin copper foils after the peeling of the respective carrier copper foils corresponds to the second metal layer.
(Second Wiring Forming Step)

As step 4, first, non-through holes having a diameter of 100 μm and extending to the respective first circuit pattern layers of the supporting substrate were formed using a carbon dioxide gas laser processing machine (manufactured by Mitsubishi Electric Corporation, ML605GTWIII-H). In order to remove smear in the non-through holes, desmear was performed. The desmear was performed by first immersing and thereby swelling the substrate in a desmear swelling liquid, PTH-B103, manufactured by Okuno Chemical Industries Co., Ltd. at 65° C. for 5 minutes, then immersing and thereby swelling the substrate in a desmear treatment liquid, PTH1200+PTH1200NA, manufactured by Okuno Chemical Industries Co., Ltd. at 80° C. for 8 minutes and lastly immersing the substrate in a desmear neutralization liquid, PTH-B303, manufactured by Okuno Chemical Industries Co., Ltd. at 45° C. for 5 minutes.

Next, a plating layer having a thickness of 0.4 to 0.8 μm was formed by means of electroless plating, and then a playing layer of 15 to 30 μm was formed by means of electrolytic plating. Consequently, the supporting substrate and the outer layers (second metal layers) were electrically interconnected through the plated parts of the respective non-through holes.

Subsequently, a second circuit pattern layer (second wiring conductor) was formed on each of the surfaces of the substrate by means of the subtractive process in which a photosensitive dry film resist (manufactured by Hitachi Chemical Co., Ltd., product name: RD-1225) is laminated on each of the subfaces and then exposed and developed along a predetermined circuit pattern in alignment with the above-described positioning holes and etching and resist peeling are then performed.
(Peeling Step)

Next, as step 5, heating at 200° C. was performed for 1 minutes to peel the resin layer off from the second laminate, together with the thermal release sheets for electronic component processing, to obtain a package substrate for mounting a semiconductor device.

Example 4

(First Laminate Preparing Step)

An example in which as peeling means, "release layer-attached copper foil" is used for intermediate layers will be described.

As step 1, a release layer-attached copper foil (JX Nippon Mining & Metals Corporation, product name: PCS, copper foil thickness: 12 μm, release layer thickness: 40 nm) was attached to each of opposite surfaces of a prepreg having a thickness of 0.1 mm (resin layer, manufactured by Mitsubishi Gas Chemical Company, Inc., product name: ST56) in such a manner that a surface opposite to a release layer surface (that is, the copper foil side) is in contact with the prepreg. Next, a copper foil (first metal layer, manufactured by Mitsui Mining & Smelting Co., Ltd., product name: 3EC-VLP, thickness: 12 μm) with a bonding layer (thickness: 3 μm) provided in advance by application and drying of an epoxy resin was disposed on each of the opposite sides in such a manner that a bonding layer surface and the release layer surface of the relevant release layer-attached copper foil are in contact with each other and was then pressed under vacuum and a press pressure of 3 MPa at a temperature of 200° C. for 60 minutes to fabricate a supporting substrate (first laminate).
(First Wiring Forming Step)

As step 2, a photosensitive dry film resist (manufactured by Hitachi Chemical Co., Ltd., product name: RD-1225) was laminated on each of opposite surfaces of the supporting substrate fabricated in step 1. Subsequently, the photosensitive dry film resist was exposed and developed along a predetermined circuit pattern, and furthermore, etching and resist peeling were performed to form a circuit pattern layer (first wiring conductor) at each of the surfaces of the substrate.
(Second Laminate Forming Step)

Subsequently, as step 3, first, in order to increase a strength of bonding between the circuit pattern layers of the supporting substrate and prepregs laminated in the present step, roughening of the surface copper of the first circuit pattern layers was performed using Clean Etch EMR-5100 manufactured by Mitsubishi Gas Chemical Company, Inc. Next, a prepreg having a nominal thickness of 0.080 mm (insulating resin layer, manufactured by Mitsubishi Gas Chemical Company, Inc., product name: SH65) and a carrier-included ultrathin copper foil (manufactured by Mitsui Mining & Smelting Co., Ltd., product name: MT18Ex, thickness: 2 μm) were disposed on each of the opposite surfaces, with the respective first circuit pattern layers formed, of the supporting substrate in such a manner that a carrier copper foil surface becomes an outermost layer, and then pressed under vacuum and a press pressure of 3 MPa at a temperature of 200° C. for 120 minutes.

Next, positioning holes were formed using an X-ray drilling apparatus. Subsequently, the carrier copper foil at each of the outermost layers of the substrate was physically peeled to form a second laminate. Each of the ultrathin copper foils after the peeling of the respective carrier copper foils corresponds to the second metal layer.

(Second Wiring Forming Step)

As step 4, first, non-through holes having a diameter of 100 μm and extending to the respective first circuit pattern layers of the supporting substrate were formed using a carbon dioxide gas laser processing machine (manufactured by Mitsubishi Electric Corporation, ML605GTWIII-H). In order to remove smear in the non-through holes, desmear was performed. The desmear was performed by first immersing and thereby swelling the substrate in a desmear swelling liquid, PTH-B103, manufactured by Okuno Chemical Industries Co., Ltd. at 65° C. for 5 minutes, then immersing the substrate in a desmear treatment liquid, PTH1200+PTH1200NA, manufactured by Okuno Chemical Industries Co., Ltd. at 80° C. for 8 minutes and lastly immersing the substrate in a desmear neutralization liquid, PTH-B303, manufactured by Okuno Chemical Industries Co., Ltd. at 45° C. for 5 minutes.

Next, a plating layer having a thickness of 0.4 to 0.8 μm was formed by means of electroless plating, and then a playing layer of 15 to 30 μm was formed by means of electrolytic plating. Consequently, the supporting substrate and the outer layers (second metal layers) were electrically interconnected through the plated parts of the respective non-through holes.

Subsequently, a second circuit pattern layer (second wiring conductor) was formed on each of the surfaces of the substrate by means of the subtractive process in which a photosensitive dry film resist (manufactured by Hitachi Chemical Co., Ltd., product name: RD-1225) is laminated on each of the subfaces and then exposed and developed along a predetermined circuit pattern in alignment with the above-described positioning holes and etching and resist peeling are then performed.

(Peeling Step)

Next, as step 5, the release layer-attached copper foils and the resin layer (prepreg) were peeled from the second laminate by applying a physical force to respective boundary portions between the respective bonding layers and the respective release layers laminated by pressing in step 1 above. Subsequently, resin (bonding layers) remaining on surfaces of the second laminate was removed by means of a desmear treatment liquid to obtain a package substrate for mounting a semiconductor device (semiconductor device mounting substrate).

Comparative Example 1

A laminate was fabricated in a manner that is entirely similar to Example 1 except that a supporting substrate including first metal layers directly provided on a prepreg (resin layer) was used without using carrier-included copper foils with respective bonding layers applied thereto in step 1 of Example 1, and an attempt was made to separate package substrate for mounting semiconductor devices. As a result, the supporting substrate and the pattern-embedded substrates were bonded via the resin of the prepreg and the substrates could not be separated.

Comparative Example 2

A laminate was fabricated in a manner that is similar to Example 1 except that: a supporting substrate including carrier-included ultrathin copper foils (manufactured by Mitsui Mining & Smelting Co., Ltd., product name: MT18Ex, thickness: 2 μm) directly provided on a prepreg (resin layer) was used without using carrier-included copper foils with respective bonding layers applied thereto in step 1 of Example 1; and first wiring conductors were fabricated by means of pattern plating instead of etching in step 2. In this case, time taken for the patterning in step 2 was around 50 minutes and thus took a length of time that is approximately ten times compared to step 2 in Example 1.

Comparative Example 3

A laminate was fabricated in a manner that is similar to Example 1 except that a supporting substrate including carrier-included ultrathin copper foils (manufactured by Mitsui Mining & Smelting Co., Ltd., product name: MT18Ex, thickness: 2 μm) directly provided on a prepreg (resin layer) was used without using carrier-included copper foils with respective bonding layers applied thereto in step 1 of Example 1, and an attempt to separate package substrate for mounting semiconductor devices. As a result, relevant parts of the carrier-included ultrathin copper foils were removed together with relevant parts of copper foils by etching in step 2, resulting in exposure of the resin layer of the prepreg, and in step 3, respective resin layers of prepregs and the resin layer of the prepreg in step 1 were welded to each other, resulting in a failure to separate the substrates in a subsequent step.

As described above, in each of Examples 1 to 3 in which a supporting substrate including a bonding layer including peeling means between the resin layer (prepreg) and each of first metal layers is used, use of the subtractive process to form first wiring conductors enables formation of package substrate for mounting semiconductor devices with steps that are fewer than those of a manufacturing method using the pattern plating process. Furthermore, in the examples, separation of the supporting substrates was smoothly performed. Also, the obtained package substrate for mounting semiconductor devices were favorable with no defects in circuit formation.

The entire disclosure of Japanese Patent Application No. 2016-154890 filed on Aug. 5, 2016 and the entire disclosure of Japanese Patent Application No. 2017-086338 filed on Apr. 25, 2017 are incorporated herein by reference.

Also, all of the literatures, the patent applications and the technical standards stated herein are incorporated herein by reference to the extent that is the same as that of the case where each of the literatures, the patent applications and the technical standards is specifically stated as being incorporated by reference.

REFERENCE SIGNS LIST 1 resin layer
2 intermediate layer
2A carrier layer (carrier copper foil)
2B ultrathin copper foil layer (metal film)
3 bonding layer
4 first metal layer
5 first wiring conductor
6 insulating resin layer
7 second metal layer
8 non-through hole
9 second wiring conductor
10 first laminate (supporting substrate)
20 second laminate (supporting substrate-attached laminate)
30 package substrate for mounting a semiconductor device

What is claimed is:

1. A supporting substrate comprising:
a resin layer;
a bonding layer that is provided on at least one surface side of the resin layer and includes a peeling medium; and
a metal layer provided on the bonding layer, wherein
the peeling medium is an intermediate layer that is disposed between the bonding layer and the resin layer,
the resin layer includes protrusion parts that cover only opposite end portions of the intermediate layer and the bonding layer,
the bonding layer is thinner than the metal layer,
the bonding layer is a non-metal layer, and
the intermediate layer is one selected from:
- an intermediate layer that is essentially consisting of a fluorine-based resin, and
- an intermediate layer that includes a release layer and a metal film having a thickness of no less than 1 μm, and the release layer is disposed on the bonding layer side.

2. The supporting substrate according to claim 1, wherein the intermediate layer is essentially consisting of the fluorine-based resin.

3. The supporting substrate according to claim 1, wherein the intermediate layer includes the release layer and the metal film having the thickness of no less than 1 μm, and the release layer is disposed on the bonding layer side.

4. The supporting substrate according to claim 1, wherein the bonding layer and the metal layer are disposed on each of opposite surfaces of the resin layer.

5. A supporting substrate-attached laminate comprising:
a resin layer;
a bonding layer that is provided on at least one surface side of the resin layer and includes a peeling medium;
an insulating resin layer provided on the bonding layer;
a first wiring conductor embedded in the insulating resin layer; and
a second metal layer provided on the insulating resin layer, wherein
the peeling medium is an intermediate layer that is disposed between the bonding layer and the resin layer,
the resin layer includes protrusion parts that cover only opposite end portions of the intermediate layer and the bonding layer,
the bonding layer is thinner than the first wiring conductor,
the bonding layer is a non-metal layer, and
the intermediate layer is one selected from:
- an intermediate layer that is essentially consisting of a fluorine-based resin, and
- an intermediate layer that includes a release layer and a metal film having a thickness of no less than 1 μm, and the release layer is disposed on the bonding layer side.

6. The supporting substrate-attached laminate according to claim 5, wherein a thickness of the bonding layer is 1 to 50 μm.

7. The supporting substrate-attached laminate according to claim 5, wherein a thickness of the bonding layer is 1 to 3 μm.

8. The supporting substrate according to claim 1, wherein a thickness of the bonding layer is 1 to 50 μm.

9. The supporting substrate according to claim 1, wherein a thickness of the bonding layer is 1 to 3 μm.

* * * * *